US 8,270,169 B2

(12) United States Patent
Paquette et al.

(10) Patent No.: US 8,270,169 B2
(45) Date of Patent: Sep. 18, 2012

(54) TRANSLATING HINGE

(75) Inventors: Jeffrey Paquette, Newton, MA (US);
Scott R. Cheyne, Brookline, NH (US)

(73) Assignee: Raytheon Company, Waltham, MA (US)

( * ) Notice: Subject to any disclaimer, the term of this patent is extended or adjusted under 35 U.S.C. 154(b) by 523 days.

(21) Appl. No.: 12/465,120

(22) Filed: May 13, 2009

(65) Prior Publication Data
US 2010/0246130 A1    Sep. 30, 2010

Related U.S. Application Data

(60) Provisional application No. 61/162,748, filed on Mar. 24, 2009.

(51) Int. Cl.
*H05K 5/00* (2006.01)
*H05K 7/20* (2006.01)
*F28F 7/00* (2006.01)
*E05D 7/04* (2006.01)
*E05D 5/10* (2006.01)
*E05F 1/08* (2006.01)

(52) U.S. Cl. .......... 361/709; 361/707; 361/679.46; 16/235; 16/242; 16/289; 16/386; 16/255; 165/80.2

(58) Field of Classification Search .......... 361/704, 361/709, 711, 679.46; 16/235, 242, 386, 16/255, 289; 165/80.2
See application file for complete search history.

(56) References Cited

U.S. PATENT DOCUMENTS

| 4,566,150 A * | 1/1986 | Boothe ............... 16/332 |
| 4,610,049 A * | 9/1986 | Dean .................. 16/286 |
| 4,730,364 A * | 3/1988 | Tat-Kee ............ 361/679.09 |
| 5,043,846 A * | 8/1991 | Kinoshita ........ 361/679.09 |
| 5,075,929 A * | 12/1991 | Chung ............... 16/342 |
| 5,500,985 A | 3/1996 | Klueger |
| 5,555,794 A * | 9/1996 | Templeton et al. ....... 99/349 |
| 5,646,826 A | 7/1997 | Katchmar |
| 5,796,582 A | 8/1998 | Katchmar |
| 5,975,693 A * | 11/1999 | Malfroy et al. ......... 351/153 |
| 6,108,868 A * | 8/2000 | Lin ................... 16/340 |
| 6,116,733 A | 9/2000 | Krumme et al. |
| 6,278,610 B1 * | 8/2001 | Yasufuku et al. ...... 361/704 |
| 6,308,650 B1 | 10/2001 | Tsumiyama et al. |
| 6,392,890 B1 | 5/2002 | Katchmar |
| 6,480,167 B2 | 11/2002 | Matthews |
| 6,484,363 B1 * | 11/2002 | Chung ............... 16/242 |
| 6,530,122 B1 * | 3/2003 | Kondou et al. ......... 16/335 |
| 6,532,628 B2 * | 3/2003 | Kim ................... 16/342 |
| 6,553,625 B2 * | 4/2003 | Lin et al. ............. 16/342 |
| 6,591,533 B2 * | 7/2003 | Wygant ................ 42/72 |

(Continued)

FOREIGN PATENT DOCUMENTS

EP    0 867 584 A2    9/1998
(Continued)

OTHER PUBLICATIONS

PCT Search Report of the ISA for PCT/US2010/026324 dated Sep. 16, 2010.

(Continued)

*Primary Examiner* — Bradley Thomas
(74) *Attorney, Agent, or Firm* — Daly, Crowley, Mofford & Durkee, LLP

(57) ABSTRACT

A translating hinge includes a translation element which provides translational movement between two objects coupled by the translating hinge and a rotating assembly coupled to the translation element.

4 Claims, 19 Drawing Sheets

U.S. PATENT DOCUMENTS

| | | | |
|---|---|---|---|
| 6,647,592 B2 | 11/2003 | Presley | |
| 6,684,456 B2* | 2/2004 | Lee | 16/342 |
| 6,705,234 B1 | 3/2004 | Miller et al. | |
| 6,772,983 B1* | 8/2004 | Liao et al. | 248/291.1 |
| 6,937,465 B2* | 8/2005 | Park | 361/679.08 |
| 6,977,810 B2* | 12/2005 | Song | 361/679.06 |
| 7,006,853 B2* | 2/2006 | Kang et al. | 455/575.3 |
| 7,047,599 B2* | 5/2006 | Oshima et al. | 16/337 |
| 7,048,135 B2 | 5/2006 | Smyers et al. | |
| 7,055,215 B1* | 6/2006 | Ligtenberg et al. | 16/307 |
| 7,055,219 B2* | 6/2006 | Shiba | 16/367 |
| 7,096,540 B2* | 8/2006 | Watanabe et al. | 16/367 |
| 7,127,778 B2 | 10/2006 | Salice | |
| 7,207,087 B2 | 4/2007 | Salice | |
| 7,251,129 B2* | 7/2007 | Lee et al. | 361/679.55 |
| 7,328,484 B2 | 2/2008 | Salice | |
| 7,348,932 B1 | 3/2008 | Puzella et al. | |
| 7,395,580 B2* | 7/2008 | Brustle et al. | 16/50 |
| 7,515,405 B2* | 4/2009 | Lev et al. | 361/679.55 |
| 7,559,117 B2* | 7/2009 | Chien | 16/367 |
| 7,665,183 B2* | 2/2010 | Choi | 16/286 |
| 7,800,893 B2* | 9/2010 | Tracy et al. | 361/679.27 |
| 7,817,436 B2* | 10/2010 | Peiker | 361/755 |
| 7,949,292 B2* | 5/2011 | Choi | 399/380 |
| 8,068,334 B2* | 11/2011 | Tang | 361/679.27 |
| 2002/0051342 A1 | 5/2002 | Kanada | |
| 2002/0178544 A1* | 12/2002 | Liu et al. | 16/260 |
| 2004/0187261 A1* | 9/2004 | Haenlein | 16/366 |
| 2004/0218229 A1* | 11/2004 | Chol | 358/474 |
| 2004/0261220 A1* | 12/2004 | Lowry | 16/50 |
| 2005/0120517 A1* | 6/2005 | Bonham | 16/238 |
| 2005/0183238 A1* | 8/2005 | McCue et al. | 16/236 |
| 2005/0198779 A1* | 9/2005 | Jung et al. | 16/367 |
| 2006/0048337 A1* | 3/2006 | Lowry et al. | 16/342 |
| 2006/0120035 A1* | 6/2006 | Merz et al. | 361/687 |
| 2006/0130277 A1* | 6/2006 | Nelson et al. | 16/327 |
| 2006/0236505 A1* | 10/2006 | Maatta et al. | 16/366 |
| 2006/0238968 A1* | 10/2006 | Maatta et al. | 361/683 |
| 2006/0279920 A1* | 12/2006 | Lee et al. | 361/683 |
| 2007/0169316 A1* | 7/2007 | Lu et al. | 16/367 |
| 2007/0214606 A1* | 9/2007 | Hoffman | 16/367 |
| 2008/0150832 A1 | 6/2008 | Ingram et al. | |
| 2008/0169973 A1 | 7/2008 | Pluymers et al. | |
| 2008/0218955 A1* | 9/2008 | Nishizawa | 361/681 |
| 2008/0222844 A1 | 9/2008 | Broadhead et al. | |
| 2008/0297995 A1* | 12/2008 | Lai | 361/680 |
| 2009/0141494 A1* | 6/2009 | Zhang et al. | 362/249.03 |
| 2010/0101054 A1* | 4/2010 | Cook | 16/382 |
| 2010/0154170 A1* | 6/2010 | Chen et al. | 16/303 |
| 2010/0232096 A1* | 9/2010 | Chen | 361/679.01 |

FOREIGN PATENT DOCUMENTS

| | | |
|---|---|---|
| EP | 0 867 584 A3 | 9/1998 |
| EP | 1 328 042 A1 | 7/2003 |
| EP | 2 418 345 A1 | 2/2012 |
| JP | 61 224504 A | 10/1986 |
| WO | WO 01/06821 A1 | 1/2001 |
| WO | WO 01/33927 A1 | 5/2001 |
| WO | WO 2007/135551 A2 | 11/2007 |
| WO | WO 2007 135551 A3 | 11/2007 |

OTHER PUBLICATIONS

Written Opinion of the ISA for PCT/US2010/026324 dated Sep. 16, 2010.

Notification of International Search Report and Written Opinion of the International Searching Authority for PCT/US2010/049261, dated Feb. 7, 2011, 11 pages.

Response to Office Action of Dec. 1, 2010 from U.S. Appl. No. 12/694,450 dated Jan. 25, 2011, 11 pages.

Final Office Action dated Mar. 23, 2011 from U.S. Appl. No. 12/694,450 dated Jan. 25, 2011, 7 pages.

PCT Invitation to Pay Additional Fees and Partial International Search Report dated Jun. 29, 2010 for PCT/US2010/026324.

Notification Concerning Transmittal of International Preliminary Report on Patentability (Chapter 1 of the Patent Cooperation Treaty), PCT/US2010/026324 date of mailing Oct. 6, 2011, 2 pages.

Written Opinion of the International Searching Authority, PCT/US2010/026324 date of mailing Oct. 6, 2011, 10 pages.

European Search Report dated Jan. 18, 2012; for EP Pat. App. No. 11188788.1; 9 pages.

* cited by examiner

TRANSLATING HINGE

RELATED APPLICATIONS

This application claims the benefit of U.S. Provisional Application No. 61/162,748 filed on Mar. 24, 2009 under 35 U.S.C. §119(e) which application is hereby incorporated herein by reference in its entirety.

FIELD OF THE INVENTION

The structures and techniques described herein relate to bearings and more particularly to hinges.

BACKGROUND OF THE INVENTION

As is known in the art, a bearing is a device which allows constrained relative motion, typically rotation or linear movement, between two parts or objects. Bearings may be classified broadly according to the motions they allow and according to their principle of operation as well as by the directions of applied loads they can handle.

A hinge is a type of bearing that connects two objects, typically allowing only a limited angle of rotation between the objects. Two objects connected by an ideal hinge rotate relative to each other about a fixed axis of rotation (the geometrical axis of the hinge). Hinges may be made of rigid or flexible material and/or of moving components. Hinges are employed in many types of doors, movable bridges, furniture, electronics, automobile doors or in any structure which it is desirable to have two objects connected but which can rotate relative to each other.

A translating hinge is a particular type of hinge which allows both a translating motion and a rotation. Two techniques have conventionally been used to provide translating hinges. One technique utilizes four bar linkages and another technique utilizes slotted hinge assemblies. Some of the drawbacks of the four bar linkage techniques are: (1) the resulting hinge does not translate in a direction which is perpendicular to a mating surface; (2) the resulting hinge has many moving parts; (3) the resulting hinge is a relatively bulky assembly and thus limits the locations/applications in which the hinge can be used. Some of the drawbacks of the slotted hinge techniques are: (1) rotation can occur before translation is complete (which could be undesirable in some applications which require translation to be complete prior to rotation); (2) the resulting hinge is relatively difficult to spring load at the translated position; and (3) tight tolerances are relatively difficult to achieve due to the precision with which a slot can be provided in the hinge structure since in general, fabrication of slots is typically accomplished by interpolating an outer profile of the slot with an end mill of a smaller diameter than the slot width. Slots provided using this technique struggle to achieve tolerances greater than +/−0.002 in. especially when the ratio of slot depth to end mill diameter exceeds 5 to 1.

SUMMARY OF THE INVENTION

In accordance with the techniques and concepts described herein, a translating hinge includes a translation element which provides translational movement between two objects coupled by the translating hinge and a rotating assembly coupled to the translation element.

With this particular arrangement, a translating hinge configured for both translational and rotational movement is provided. When the translating hinge couples two objects having surfaces in contact or in proximity to each other, the translation element allows the objects to translate in a direction which is perpendicular to the surfaces of the objects (sometime referred to herein as true vertical translation). In one embodiment, the translation element includes a shaft which guides the movement of an object being translated. In some embodiments, the translation element includes a spring which provides a force to move the object. In other embodiments, the translating hinge and objects may be arranged such that the force to move the object may be provided by gravity, for example. Alternatively still, an external force-providing device (e.g. a pneumatic or other device) may be used to provide a force to cause movement of the object. Such force-providing devices may be provided as an integral part of the translating hinge (e.g. mechanically coupled to the translation element) or may be separate from the translating hinge. In cases in which a spring is used, by selecting the size and stiffness of the spring to be self-supporting, the spring can support the weight of the object being rotated. Stated differently, the translating hinge can hold an object being rotated in a plurality of different positions during a rotation movement. In one embodiment, the spring is provided as a coil spring and the shaft in the translation element is provided as a screw. In one embodiment, the screw is provided as a shoulder screw disposed through a counter-bored threaded hole in the rotating assembly and through a central region of the coil spring.

In the coil spring embodiment, outside/inside diameters of the spring are selected such that the spring fits over a shank of the shoulder screw but are not so large that the spring would take up too much space. Also the force (stiffness)/compression characteristics of the spring are selected such that the force provided from the spring exceeds the weight of the object the hinge is supporting when the hinge is in the translated position. The spring force increases proportionally to the compression. Thus, the spring must provide enough force in the translating position to hold the object being moved while still having enough range of motion to compress without bottoming out in a stowed position of the translating hinge.

Spring stiffness is derived from the material from which the spring is made, and the geometry of the spring (e.g. coil diameter, wire diameter, # coil turns per inch). In preferred embodiments, the spring is not used beyond a load length (i.e. a length slightly larger than the solid height which is a maximum compressed length of a spring). Not using the spring beyond its load length avoids reaching the solid height. It is desirable to avoid compressing the spring to its solid height because then the applied load would spike by a considerable amount, as the system would be compressing solid metal as opposed to bending the metal). Another important factor to consider is the free length of the spring (i.e. the length of the spring when no force is applied). It should be noted that there may exist different springs with the same stiffness constant that have different free and load lengths, depending upon the geometry and material characteristics (from which is derived the stiffness constant). It should of course, be appreciated that the spring may be provided as a compression spring, an extension spring or another type of spring could be used.

If the translating element and rotating element are provided from tightly toleranced parts (e.g. provided by a machining operation which achieves specified part dimensions with small variations) and by using a counter-bored threaded hole for the shoulder screw, the translating hinge can provide very precise alignment between the hinged objects. The purpose of the counter bore is for alignment of the shoulder screw. Such precise alignment is desirable, for example, in applications which require mating of mechanical and/or electrical interconnects (including but not limited to blind mate interconnects) disposed on separate objects coupled by the translating hinge. Furthermore, this approach (i.e. utilizing tightly toleranced parts) eliminates the need for any other alignment features between the objects being coupled by the translating hinge. The translating hinge described herein is thus appropriate for use in applications requiring critical alignment between hinged objects. For example, in applications which require mating of electrical connections between two objects, mating of mechanical connections between two objects and/ or in applications in which EMI/weather gaskets are disposed between two objects and/or in applications in which two objects have mechanical features which must be aligned.

Also, by including in the hinge a spring which can support and hold an object during a rotation operation and which can firmly hold an object in a rotated position, the translating hinge helps prevent the supported object from accidental contact and potential damage with proximately located objects or other structures within a predetermined envelope of rotation. Thus, by properly sizing the spring such that the spring provides enough force to firmly hold an object in one or more rotated positions during a rotation operation, the hinge is said to be self supporting during rotation. In an environment in which objects are arranged in close proximity to each other (i.e. in a tightly packed environment), the self supporting feature helps prevent accidental contact and potential damage between neighboring structures.

Furthermore, the rotating assembly of the translating hinge described herein allows access to objects within tightly packed structures. By rotating one object in a given direction, access to other objects located below the rotated object is provided. In a radar system having tightly packed components, for example, the translating hinge allows access to components within the radar system without removing other components from the radar system and without disturbing neighboring components to gain accessibility to a desired component.

Since the translation element provides true vertical translation, the translating hinge allows for the effective use of EMI/weather gaskets and electrical interconnects between the hinged objects. In one embodiment described herein in which the translation element comprises a shoulder screw, the translation length can be modified by shortening or lengthening the shoulder screw. The ability to easily lengthen or shorten translation length increases the design flexibility for hinging objects of different thicknesses and/or heights and/or other mechanical characteristics. Thus, the translating hinge can be provided as a high precision, self supporting hinge with an internal axis of rotation and true translational component.

Additionally, the translating hinge described herein allows access to hinged objects having interfacing surfaces thereby facilitating disassembly and rework when needed.

In one application, for example, translating hinges of the type described herein can be used in electronic systems such as radar systems. Such translating hinges are particularly useful in radar systems having array antennas fabricated in accordance with a so-called "panel architecture" such as that described in U.S. Pat. No. 7,348,932 assigned to the assignee of the present invention. Array antennas having a panel architecture such as that described in the aforementioned U.S. Pat. No. 7,348,932 can utilize layering or stacking of electronics as this allows the array antenna to be relatively thin (and thus the array antenna is said to have or maintain a low profile).

The electronics, however, contain components which utilize electrical power (typically from a DC signal) and the components dissipate energy in the form of heat. Stacking the electronics to form a panel can thus result in the antenna panel generating a substantial amount of thermal energy. Consequently, the antenna panel (and in particular the electronics within the antenna panel) need to be cooled. Radar systems which operate in the medium to high power range often rely on heat sinks which use liquid cooling often referred to as cold plates. Thus, the antenna panel is coupled to a cold plate (or a portion of a cold plate). Similarly, electronics used in the radar system and proximately located to the antenna panels also dissipate energy in the form of heat and thus are also coupled to a second cold plate. To maintain a low profile, the electronics are disposed in a recess region of the second cold plate. If the two cold plates are coupled together (e.g. by screws or the like), the electronics are effectively inside a cavity region and thus are not accessible without separating the two cold plates.

By coupling the two cold plates via a translating hinge the cold plates can be separated thereby providing access to the electronics. Thus, coupling the cold plates via a translating hinge is beneficial because the translating hinge captivates both assemblies (i.e. both cold plates with the associated electronics) thus improving serviceability of both assemblies.

Furthermore, since the two heat sinks are coupled via the translating hinge, it is not necessary to completely separate the two heat sinks for servicing either the heat sinks or the electronics. Since neither heat sink is loose during service, this reduces the chance of damage to either assembly while one (or both) of the assemblies is being serviced. Coupling the heat sinks via translating hinges can also eliminate the need for a coolant quick disconnects that would otherwise be required to separate the cold plates. Fewer quick disconnect couplings means fewer leaks and a more robust, reliable system. Furthermore, the translating hinge described herein allows electrical interconnections between the two assemblies to remain intact during servicing. This reduces the possibility of damage to connectors (e.g. due to disconnecting and reconnecting electrical connectors) and allows access to the heat sinks and electronics and testing thereof to be performed in an easily accessible configuration.

By allowing for more than two layers of components to be hinged together and independently accessible, the translating hinge described herein also provides a framework for future growth of RF systems utilizing panel array antenna architectures. For example, a stack of three or more cold plates could be coupled via translating hinges. Assemblies other than cold plates or heat sink assemblies could also be stacked. For example, multiple electronics modules which do not require a heat sink could be stacked. Or combinations of cold plates, heat sinks and/or electronics modules could be coupled via translating hinges. Thus, the hinge itself is scalable to operate with objects of different sizes and shapes while at the same time providing system scalability.

The translating hinge described herein thus preferably incorporates at least one or more of the following characteristics: (1) the hinge axis of rotation is within a predefined envelope of an LRU which allows serviceability of the LRU while assembled into a tightly packed structure (e.g. a RF system having a panel architecture); (2) having the axis of rotation within the LRU envelope requires translation before rotation; (3) the object undergoing the translation movement is stable in a translated position; (4) the two objects coupled by the translating hinge can be precisely aligned to each other to allow accurate blind mating to occur (e.g. blind mating of electrical interconnects and/or EMI gaskets between the two objects).

BRIEF DESCRIPTION OF THE DRAWINGS

The foregoing features of this invention, as well as the invention itself, may be more fully understood from the following description of the drawings in which.

DETAILED DESCRIPTION OF THE PREFERRED EMBODIMENTS

Figure 1:
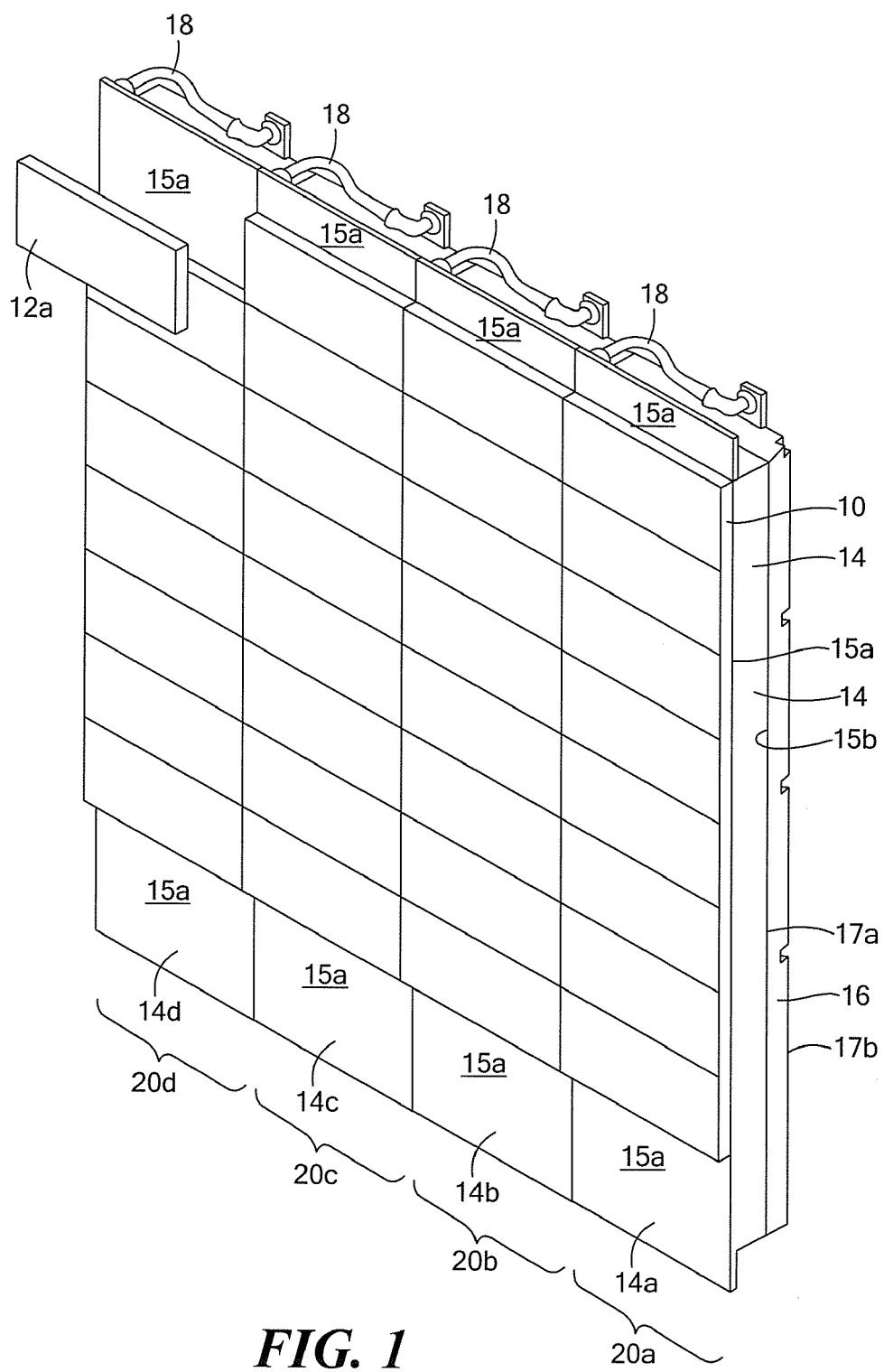
FIGS. 1-3 are a series of isometric views showing front, back and side views of a radio frequency (RF) transmit/receive system.

Described herein is a translating hinge which can be used to couple two objects. Before describing a translating hinge, it should be appreciated that reference is sometimes made herein to a translating hinge being used in a radio frequency (RF) transmit/receive system and in particular in a radar system having a so-called panel architecture. It should also be appreciated, however, that references to such radar systems are made only for the purpose of promoting clarity in the description and drawings with respect to the concepts being described and claimed and such references are not intended to be, and should not be, construed as limiting.

It is fully appreciated that the translating hinge concepts described herein find use in a wide variety of applications including both commercial and military applications. The translating hinge concepts described herein may find particular use in any application in which it is desired to include a hinge which provides both a translation motion and a rotation motion. The translating hinge concepts find particular use in applications in which structures are closely spaced and access to certain portions of a structure is needed. Such applications include but are not limited to doors, movable bridges, furniture, electronics, appliances (waffle makers, etc.), copy machines, automobiles, RF systems including RF radar systems having a panel architecture or in any structure which includes two objects which would benefit from being rotatably coupled.

Referring now to FIGS. 1-4, in which like elements are provided having like reference designations throughout the several views, a portion of a radar, communications or other radio frequency (RF) transmit/receive system includes an array antenna 10 provided from a plurality (or array) of so-called RF "antenna panels" 12a-12N, generally denoted 12 (sometimes more simply referred to herein as "panel 12"). Thus, array antenna 10 is said to have a "panel architecture."

One example of an antenna panel is described in U.S. Pat. No. 7,384,932 assigned to the assignee of the present invention.

In preferred embodiments, the antenna panels 12 are stand alone units. That is, the panels 12 are each independently functional units (i.e. the functionality of one panel does not depend on any other panel). For example, the feed circuit for each panel 12 are wholly contained within the panel itself and is not coupled directly to any other panel. Thus, in the event that one panel 12 fails, the panel 12 may simply be removed from the array 10 and another panel can be inserted in its place. This characteristic is particularly advantageous in RF transmit/receive systems deployed in sites or locations where it is difficult to service the RF system in the event of some failure.

As described in the aforementioned U.S. Pat. No. 7,389,432, it is preferable for the antenna panels used in antennas having a panel architecture to maintain a low profile. This can be accomplished by utilizing a plurality of multilayer circuit boards which provide one or more circuit assemblies in which RF and other electronic components are disposed in close proximity with each other. The operation of such electronic components utilizes electrical power and thus the components dissipate energy in the form of heat. Thus, the antenna panels 12 must be cooled.

As shown in FIGS. 1-3B, array antenna 10 (and more specifically RF panels 12) are coupled to a panel heat sink 14. In this exemplary embodiment, heat sink 14 is comprised of a plurality, here four, separate sections 14a-14d. A first surface of each heat sink section 14a-14d is designated 15a and a second opposing surface of each heat sink section 14a-14d is designated 15b. Thus, RF panels 12 are coupled to the first surface 15a of heat sink 14.

Figure 2:
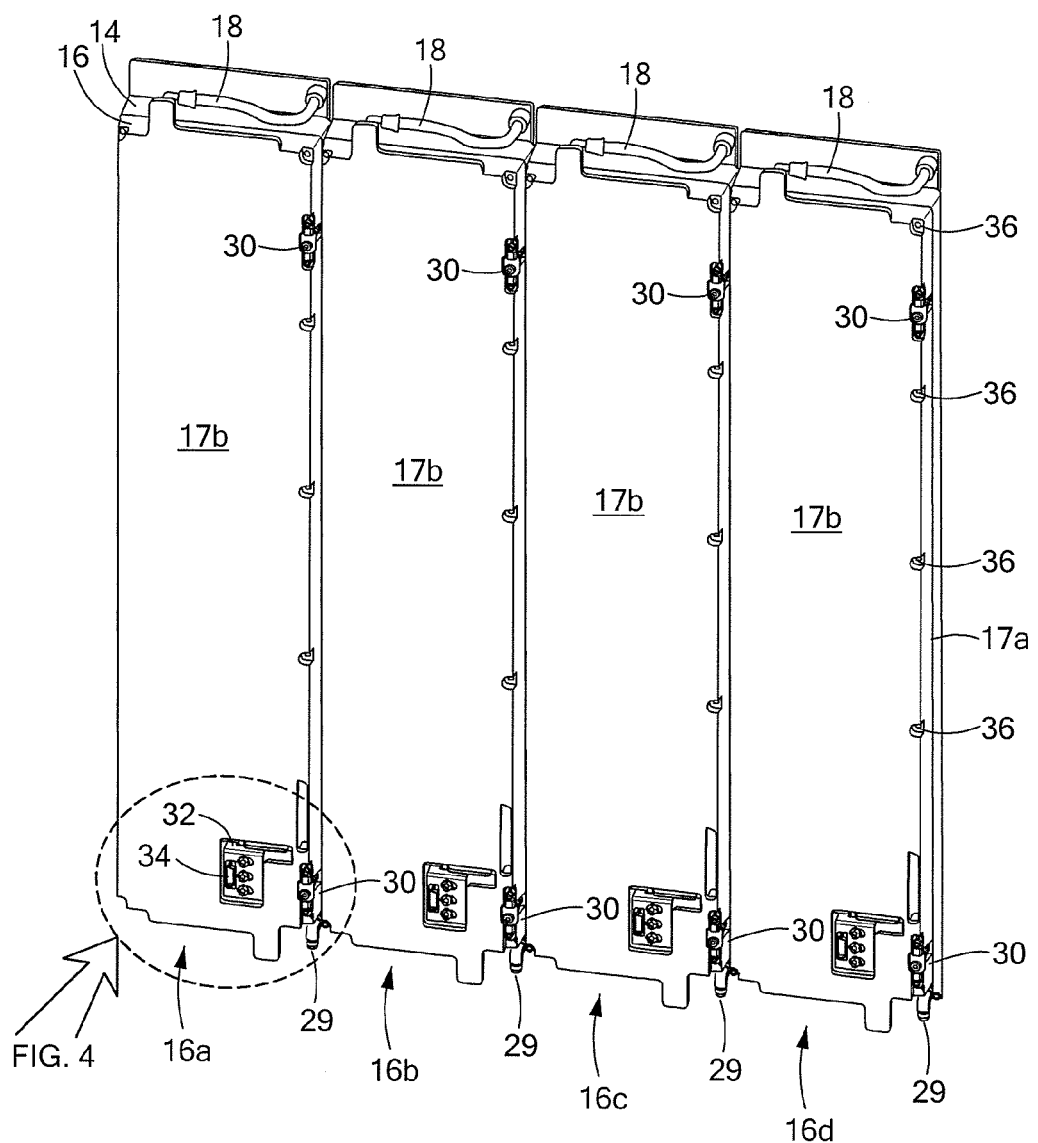

A rear heat sink 16 is coupled to surface 15b of heat sink 14. In this exemplary embodiment, rear heat sink 16 is comprised of a plurality, here four, separate sections 16a-16d (FIG. 2). A first surface of each heat sink section 16a-16d is designated 17a and a second opposing surface of each heat sink section 16a-16d is designated 17b. Thus, portions of heat sink surface 15b contact portions of heat sink surface 17a.

A set or combination of heat sink sections and associated panels can be removed from the array and replaced with another set of heat sink sections and associated panels. Such a combination is referred to as a line replaceable unit (LRU). For example, heat sink sections 14a, 16a and the panels dispose on heat sink section 14a form a LRU 20a. Thus, the exemplary system of FIG. 1 comprises four LRUs 20a-20d with each of the LRUs comprised of eight panels 12, one of panel heat sink sections 14a-14d and a corresponding one of rear heat sink sections 16a-16d. As will become apparent from the description of FIG. 3A hereinbelow, in one embodiment, panel heat sink sections 14a-14d and rear heat sink sections 16a-16d are provided having a "U" shaped cross sectional shape. Thus, when the panel heat sink sections 14a-14d and corresponding rear heat sink sections 16a-16d are coupled an internal cavity is formed therebetween in which power and logic circuits/electronics are disposed.

Figure 3:
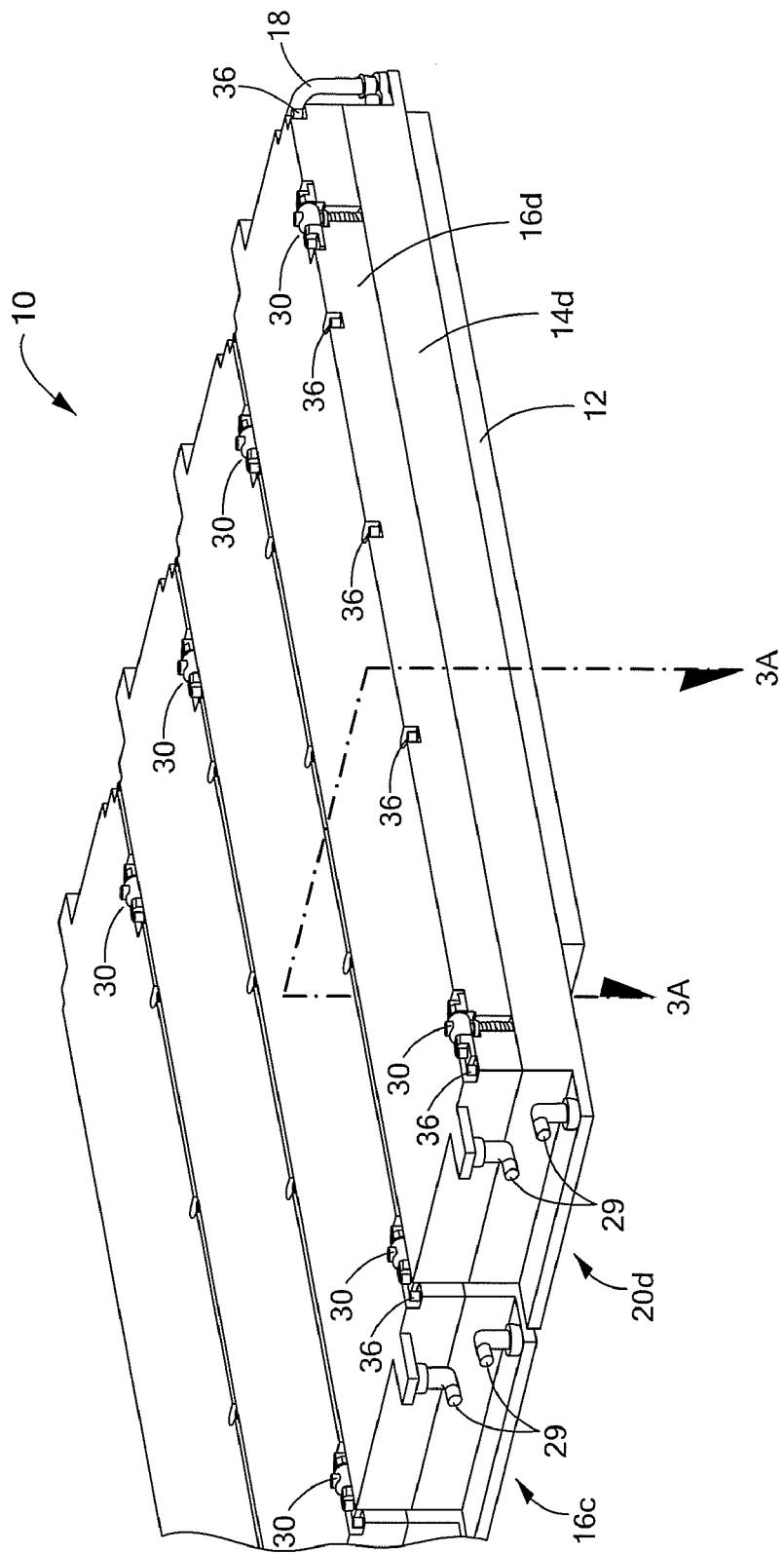
Figure 3A:
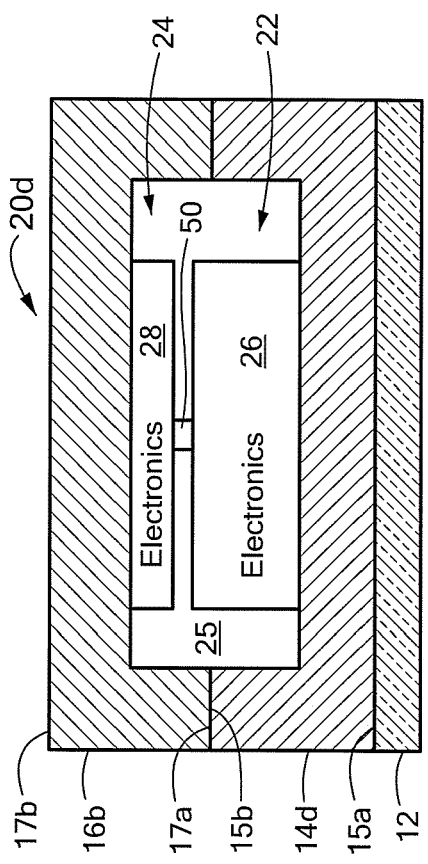
FIG. 3A is a cross-sectional view of a(line replaceable unit (LRU) shown in FIG. 3 and taken across lines 3A-3A in FIG. 3.
Figure 3B:
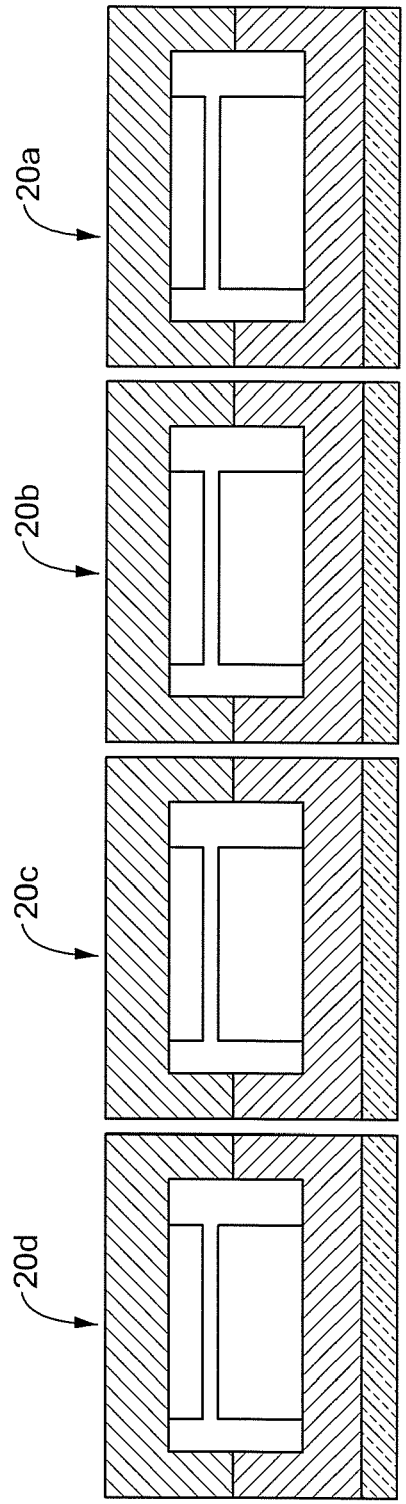
FIG. 3B is a cross-sectional view of a plurality of LRUs.

Referring briefly to FIG. 3A, taking LRU 20d as representative of LRUs 20a-20c, each of heat sinks 14d, 16d are provided having respective recess regions 22, 24 in which electronics 26, 28 are disposed. Thus, when the heats sinks 14, 16 are coupled together, the electronics 26, 28 are effectively disposed in a cavity region 25 formed by the recesses 22, 24 and associated internal surfaces of the respective heat sinks 14, 16. Thus, panel heat sink 14 primarily cools antenna panels 12 and electronics 26 while rear heat sink 16 primarily cools the electronics 28.

It should, of course, be appreciated that in other embodiments other heat sink configurations may be desired or required. For example, only 1 of the heat sinks 14, 16 may be provided having a recess region with electronics disposed therein. Alternatively, in some embodiments, neither of the heat sinks 14, 16 may be provided having a recess region. The particular manner in which to provide the heat sinks and in which to couple the electronics depends upon the particular application and the factors associated with the application.

Referring again to FIGS. 1-3, in one embodiment, heat sinks 14, 16 are provided as so-called cold plates which utilize fluid to cool any heat generating structures (such as panels 12 and electronics 26, 28) coupled thereto. A fluid is fed through channels (not shown) provided in the heat sinks 14, 16 via fluid fittings 29 and fluid paths 18. It should be appreciated that each of the heat sinks 14, 16 may be comprised of a plurality of different components or subassemblies coupled together (as shown in FIGS. 1-3) or alternatively heat sinks 14, 16 may be provided as monolithic structures. In other embodiments, air cooling can be used.

Since the electronics are disposed between a surface of the panel heat sink and an internal surface of the rear heat sink, the electronics 26, 28 are not accessible when the panel heat sink 14 and rear heat sink 16 are coupled as shown in FIGS. 1-3. Thus, to provide access to the recess region of the rear heat sink 16 (and thereby provide access to the electronics disposed in the recess region of rear heat sink 16), one or more translating hinges 30 couples panel heat sinks 14a-14d to respective ones of rear heat sinks 16a-16d. Thus, as will become further apparent from the description hereinbelow, the translating hinge allows access to the electronics disposed in recess regions 22, 24 thereby facilitating disassembly and rework of the electronics 26, 28 (or portions thereof) and/or heat sinks (or portions thereof) when needed.

Figure 4:
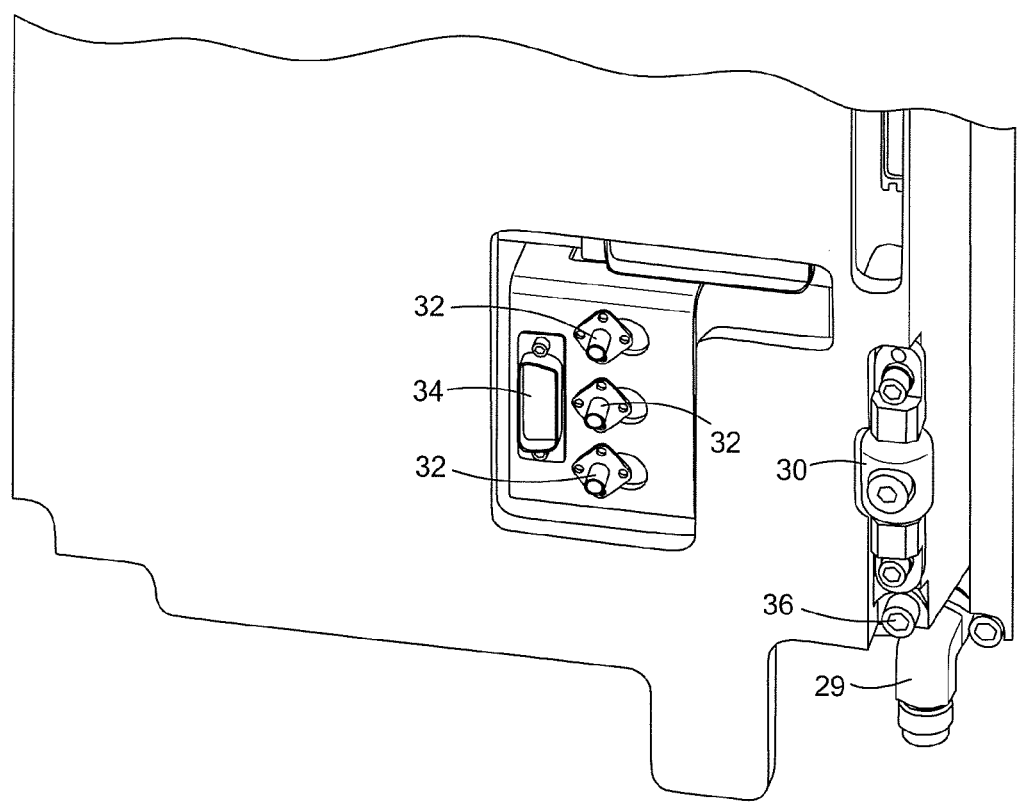
FIG. 4 an enlarged top view of a hinge on the radio frequency (RF) transmit/receive system—taken across lines 4-4 in FIG. 2.

As may be more clearly seen with reference to FIGS. 2, 3 and 4, heat sinks 14a-14d are coupled to heat sinks 16a-16d via a plurality of fasteners 36 and a plurality of translating hinges 30. In the exemplary embodiment of FIGS. 1-4, fasteners 36 are provided as screws which are captive in heat sink 16 and which mate with threaded holes provided in heat sink 14. It should be appreciated that one of ordinary skill in the art will understand how to select an appropriate type and number of fasteners 36 to use in any particular application. In one embodiment, fasteners 36 may be provided as spring-loaded, captive screws.

As may be most clearly seen in FIGS. 3 and 4, translating hinge 30 couples panel heat sink 14d to rear heat sink 16d. Hinging these two assemblies (i.e. panel heat sink 14d and rear heat sink 16d) is beneficial since when servicing either of the assemblies, hinges 30 captivate the heat sinks 14d, 16d and thus neither heat sink 14d, 16d is loose. This reduces the chance of damage to either of heat sinks 14d, 16d. Also, since neither heat sink is ever loose, the translating hinges 30 improve serviceability of the heat sinks 14, 16 as well as the serviceability of the electronics 26, 28 disposed in the recess regions of heat sinks 14d, 16d.

It should be appreciated that in FIGS. 2 and 3 each of panel heat sinks 14a-14d are coupled to respective rear heat sinks 16a-16d by a pair of translating hinges, in other embodiments fewer or more than two translating hinges may be used. After reading the disclosure herein, one of ordinary skill in the art will understand how to select an appropriate number of translating hinges to use in any particular application.

The translating hinge approach also eliminates the need for a coolant quick disconnect that would be required to separate the two cold plates. Fewer quick disconnects mean fewer leaks and a more robust, reliable system. Furthermore, electrical interconnections to (e.g. from external locations as through RF and DC/logic connectors 32, 34 in FIG. 4) and/or between electronics 26, 28 can remain intact during servicing. This reduces the possibility of damage to connectors (e.g. due to disconnecting and reconnecting electrical connectors) and also allows access to and testing of the electronics in an easily accessible configuration (e.g. as will be shown and described below in conjunction with FIG. 5C).

Figure 5:
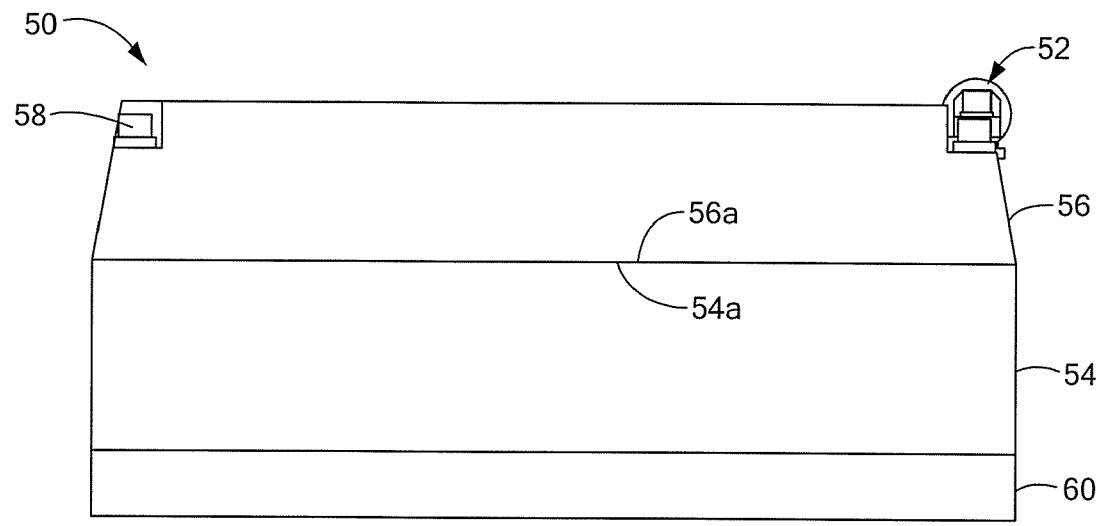
FIGS. 5-5C are a series of end views of a line-replaceable unit (LRU) which illustrate a process of releasing a translating hinge and rotating an object which comprises the LRU.
Figure 5A:
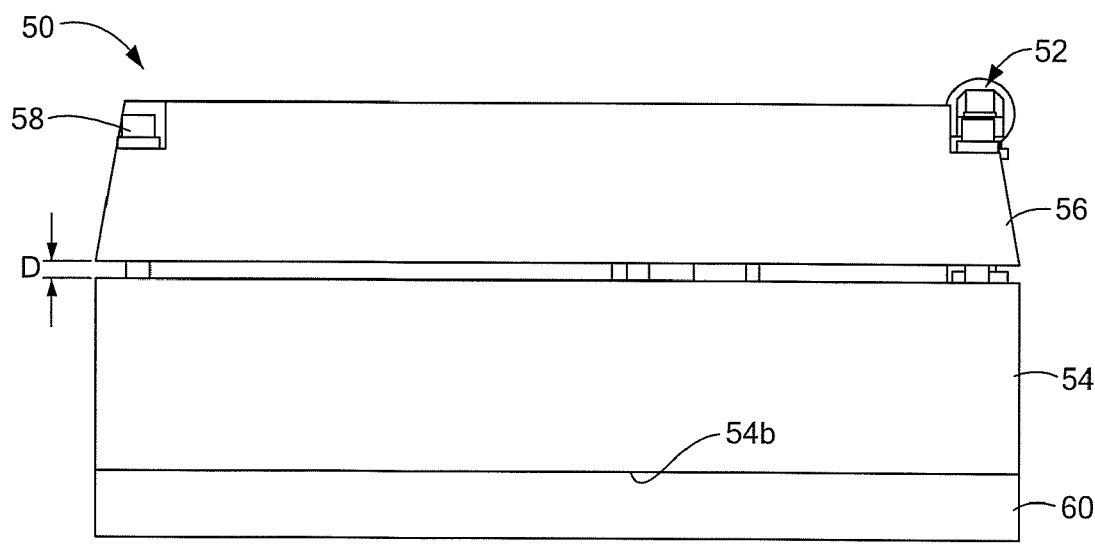
Figure 5B:
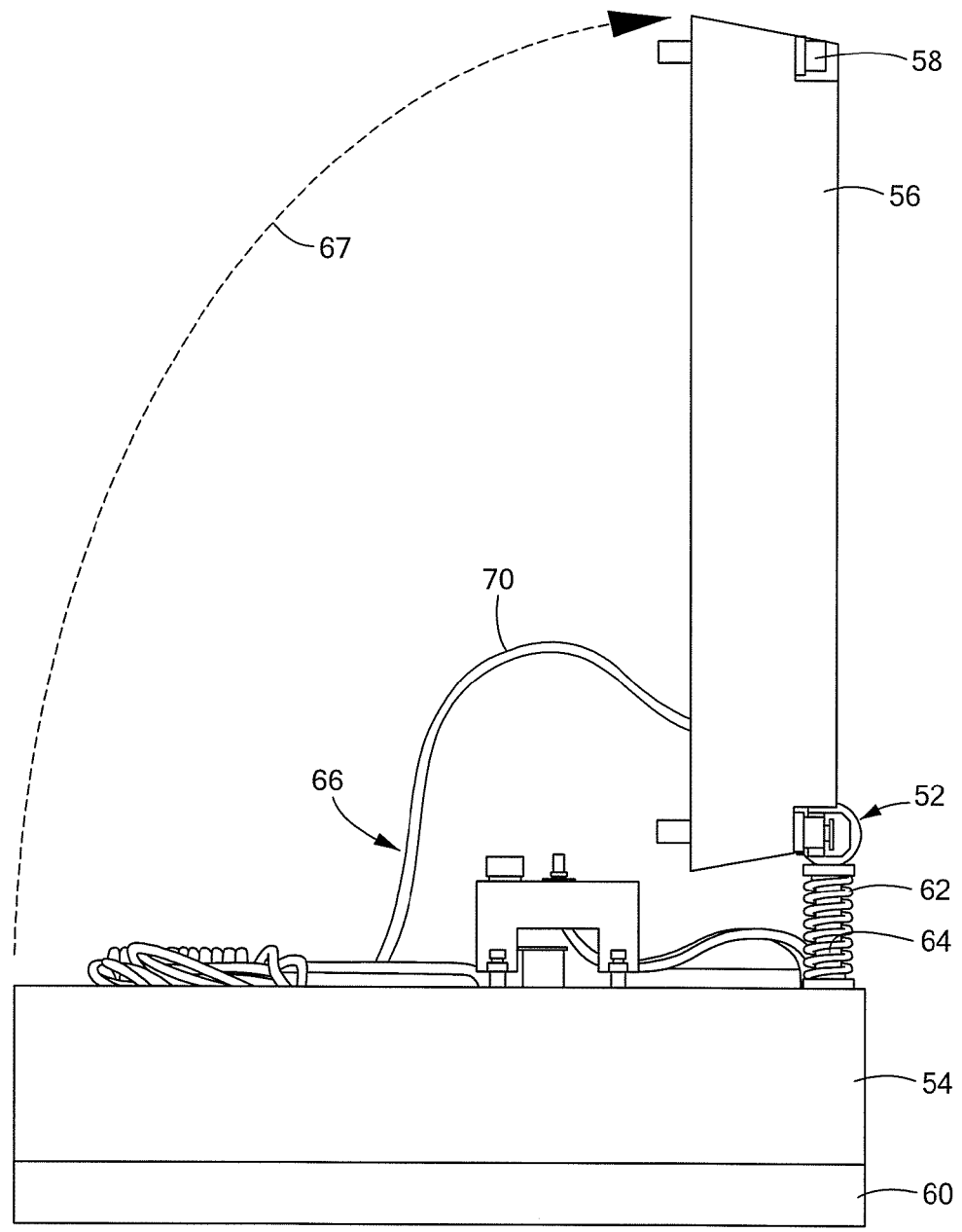
Figure 5C:
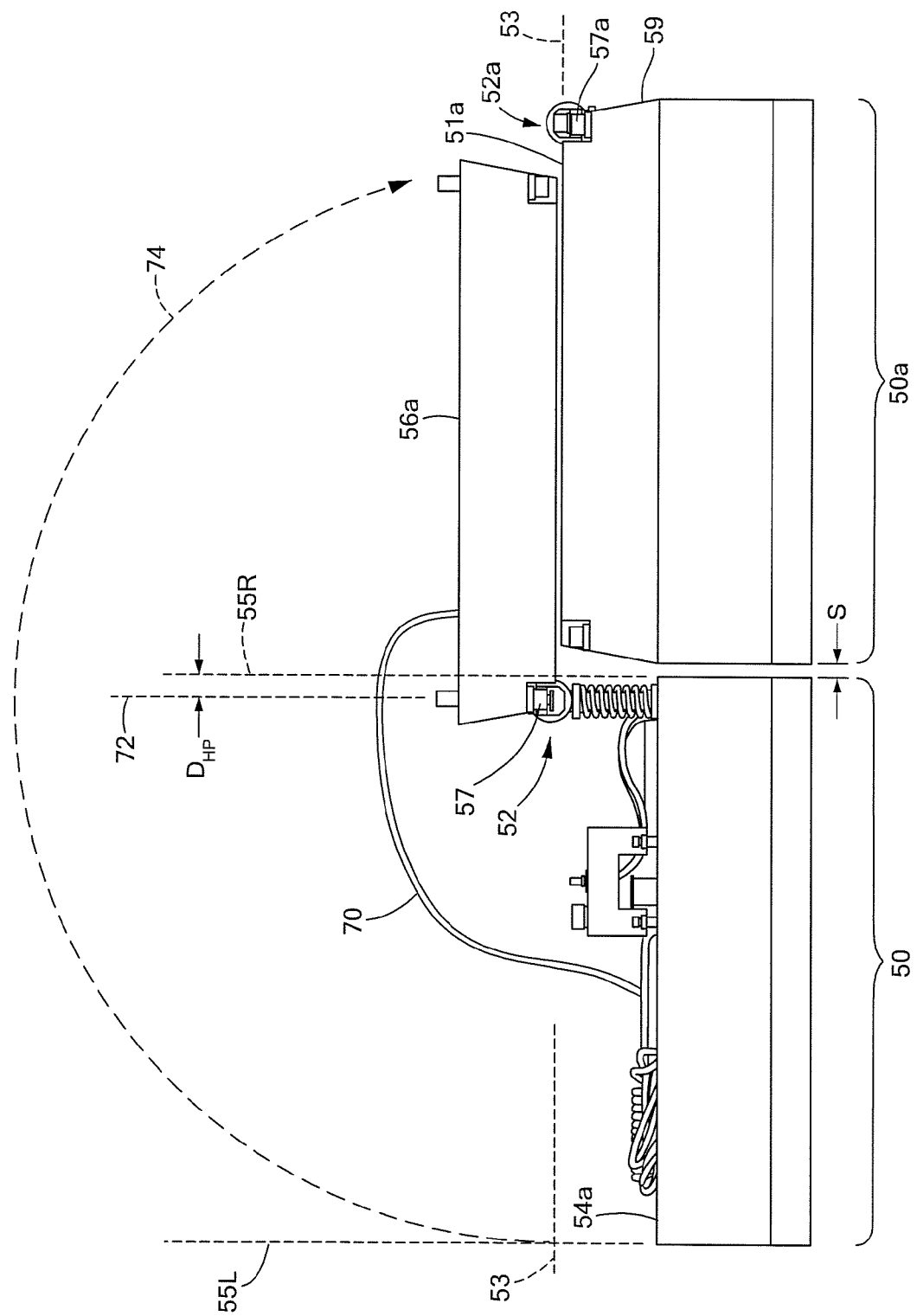

Referring now to FIGS. 5-5C in which like elements are provided having like reference designations thoughout the several views, a line replaceable unit (LRU) 50 includes a translating hinge 52 which couples a first object 54 to a second object 56. One or more fasteners 58 secures the first and second objects 54, 56. For clarity in the description and the drawings, only one fastener 58 is shown. It should, however, be appreciated that although only one fastener 58 is shown in FIGS. 5-5C, those of ordinary skill in the art will appreciate that multiple fasteners may be used to secure together objects 54, 56 and it should also be understood that one of ordinary skill in the art will understand how to select an appropriate number of fasteners to use in any particular application. Similarly, although only one translating hinge is shown in FIGS. 5-5C, it should be appreciated that multiple translating hinges may be used to couple together objects 54, 56 and it should also be understood that one of ordinary skill in the art will understand how to select an appropriate number of translating hinges to use in any particular application.

The LRU 50 may be the same as or similar to the LRUs 20-20d described above in conjunction with FIGS. 1-4. Similarly, the first object 54 may correspond, for example, to a panel heat sink such as panel heat sink 14 described above in conjunction with FIGS. 1-4 and the second object 56 may correspond, for example, to a rear heat sink such as rear heat sink 16 described above in conjunction with FIGS. 1-4. Also, fasteners 58 may be the same as or similar to captive screws 36 described above in conjunction with FIGS. 1-4 (e.g. fasteners 58 may be provided as captive screws or as spring-loaded captive screws). Other types of fasteners may, of course, also be used.

First and second objects 54, 56 have opposing surfaces 54a, 56a in proximity (as shown in the exemplary embodiment of FIG. 5, at least some portions of surfaces 54a, 56a are in contact with each other). A third object 60 is coupled to a second surface 54b of object 54. The third object may or may not be coupled to object 54 via one or more translating hinges.

In FIG. 5, translating hinge 52 is shown in a closed or engaged position meaning that the two objects 54, 56 are coupled such that surfaces 54a, 56a are in a desired proximity to each other or even in contact with each other (as shown in FIG. 5).

In FIG. 5A, fastener 58 has been disengaged allowing translating hinge 52 to move to its translated position. By moving to its translated position, translating hinge 52 raises object 56 with respect to the object 54. It should be appreciated that translating hinge 52 translates in a direction which is perpendicular to mating surfaces 54a, 56a. Thus, the translating hinge translation element provides the translating hinge having true vertical translation. This allows for the effective use of EMI/weather gaskets and electrical interconnects, for example, between the objects 54, 56.

It should also be appreciated that in an alternate configuration, the translating hinge can be made to rotate parallel to the mating surfaces. It should, however, be appreciated that either all of the axis of rotation or all of the axis of translation should be aligned to prevent binding of the translating hinges with each other during their translating/rotating operations.

In FIG. 5A, the translation length is indicated by a distance D. One or more springs 62 (FIG. 5B with only one spring visible in FIGS. 5-5C) provides a force which is large enough to translate and hold object 56 above object 54. It should be appreciated, and as will become apparent from the description of FIGS. 6-7A, the translation length can be modified (e.g. either shortened or lengthened) by shortening or lengthening the translation element. In one embodiment, the translation element also comprises a shoulder screw 64 (FIG. 5B) disposed through a central longitudinal region of spring 62 and the translation length is modified (e.g. either shortened or lengthened) by shortening or lengthening the length of the shoulder screw. Suitable adjustments in the properties of spring 62 may also be required.

As shown in FIG. 5B, once the translating hinge 52 translates and thereby separates object 54 from object 56, object 56 can then be rotated vertically away from object 54. In FIG. 5B, object 56 is shown moved into a ninety degree position with respect to heat sink 14.

It should be appreciated that by properly sizing the spring 62 to firmly hold the rotating assembly 56 in a retracted position during rotation, the hinge 52 is said to be self supporting during rotation meaning that translating hinge 52 can hold object 56 in a desired position. This prevents accidental contact and potential damage between coupled objects 54, 56 and between other components in proximity to the objects 54, 56 such as an adjacent LRU 50a (FIG. 5C).

With object 56 rotated into a vertical position with respect to object 54, portions of electronics generally denoted 66 can be seen. It should be appreciated that one or both of objects 54, 56 may be provided having a recess region sized to accommodate electronics 66.

When the translating hinge 52 is in its closed position (as shown in FIG. 5), electrical connections between electronics 66 and other electronics (not visible in FIG. 5) are made and those electrical connections may be maintained by utilizing electrical signal paths such as signal path 70 (FIG. 5C). Thus, electrical connections between electronics 66 and other electronics need not be interrupted by rotating the object 56 away from object 54.

Referring now to FIG. 5C, the hinge 52 (and thus object 56) is shown rotated into a 180 degree position and thus LRU 50 is able to nest with an adjacent LRU 50a. Since the LRUs 50, 50a are the same height, such 180 degree rotation is accomplished by the translating hinge 52 first translating vertically. This moves the axis of rotation 57 of translating hinge 52 above a plane 53 defined by a top surface 51a of LRU 50a. It should be noted that hinge 52a is in its closed (or un-translated) position and that in this position hinge point 57a is below plane 53. If hinge 52a did not translate hinge point 57a above plane 53, then a mechanical interference between the hinged objects would occur and without some additional relative movement between the objects, it would not be possible to open LRU 50a.

Also, since the translating hinge 52 moves in a true vertical direction (i.e. surface 56a of object 56 moves in direction perpendicular to surface 54a of object 54), the axis of rotation 72 of translating hinges 52 is able to be within the width envelope of the LRU defined by reference lines 55R, 55L in FIG. 5C. Without the translation motion, the axis of rotation 72 would need to be outside the width of LRU 50 (i.e. to the right of reference line 55R otherwise the two mating surfaces 54a, 56a will bind). The translational element of the hinge strictly enables the axis of rotation to be within the width envelope of the LRU and creates a zone of true vertical translation that may be required for connector insertion, alignment pin engagement, etc. This is required in embodiments in which the spacing S between adjacent LRUs is small. For example in one application the LRU-to-LRU spacing S is approximately about 0.020 in.

It should also be noted that each LRU 50, 50a has angled or chamfered sides 59. However, if the translation provided by hinges 52, 52a were a large enough distance, then angled surface 59 would not be needed. It should also be appreciated that the location of the hinge points 57, 57a with respect to the LRU edges (i.e. the plane 55R defined by the side of the LRU) is proportional to the translation height. In FIG. 5C, the distance of the hinge point 57 from edge 55R is designated $D_{HP}$. In one embodiment, the spacing S between LRUs is approximately 0.020 in. and the translation height provided by the translating hinges is approximately 0.200 in above the surface of the LRU (e.g. for hinge 52a, the distance is approximately 0.200 in above plane 53 defined by surface 51a). In this case, the distance $D_{HP}$ is approximately 0.450 in.

As mentioned herein, in one embodiment reference to the hinge being "within the envelope" refers to the hinge being within the width envelope of an LRU (i.e. within the region defined by LRU edges which define reference lines 55R, 55L. By allowing the object 56 to be rotated 180 degrees, the hinge 52 allows serviceability to components (e.g. electronics disposed in recess regions of objects 54, 56) without removing the LRU 50 from a closely packed array of similar LRUs or other objects having substantially the same thickness as the LRU having the translating hinge coupled thereto. Thus, the translating hinge 52 allows access to LRU 50 without disturbing a neighboring LRU e.g. LRU 50a (or any other structure).

Figure 6:
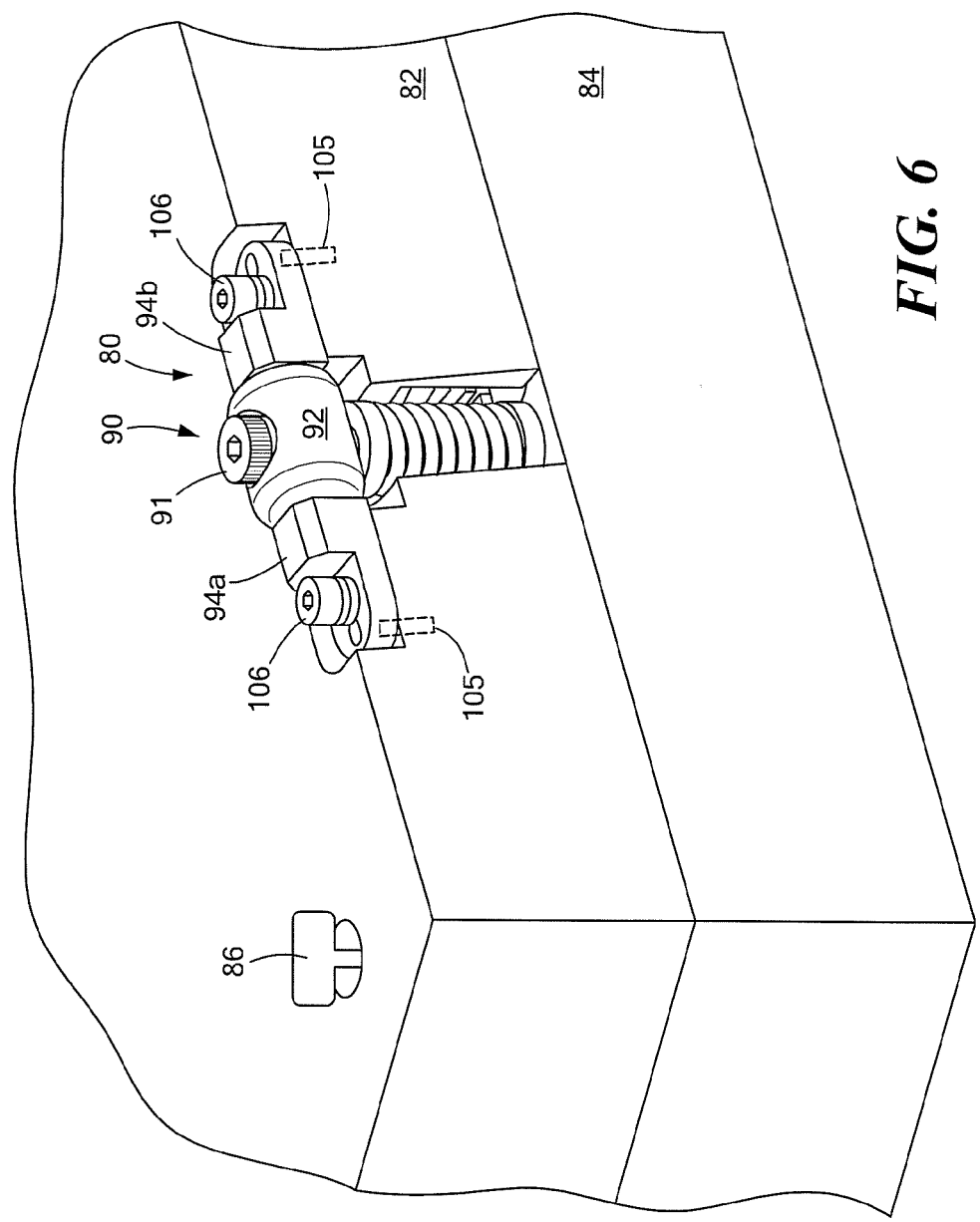
FIG. 6 is an enlarged isometric view of a translating hinge in an engaged position.
Figure 7:
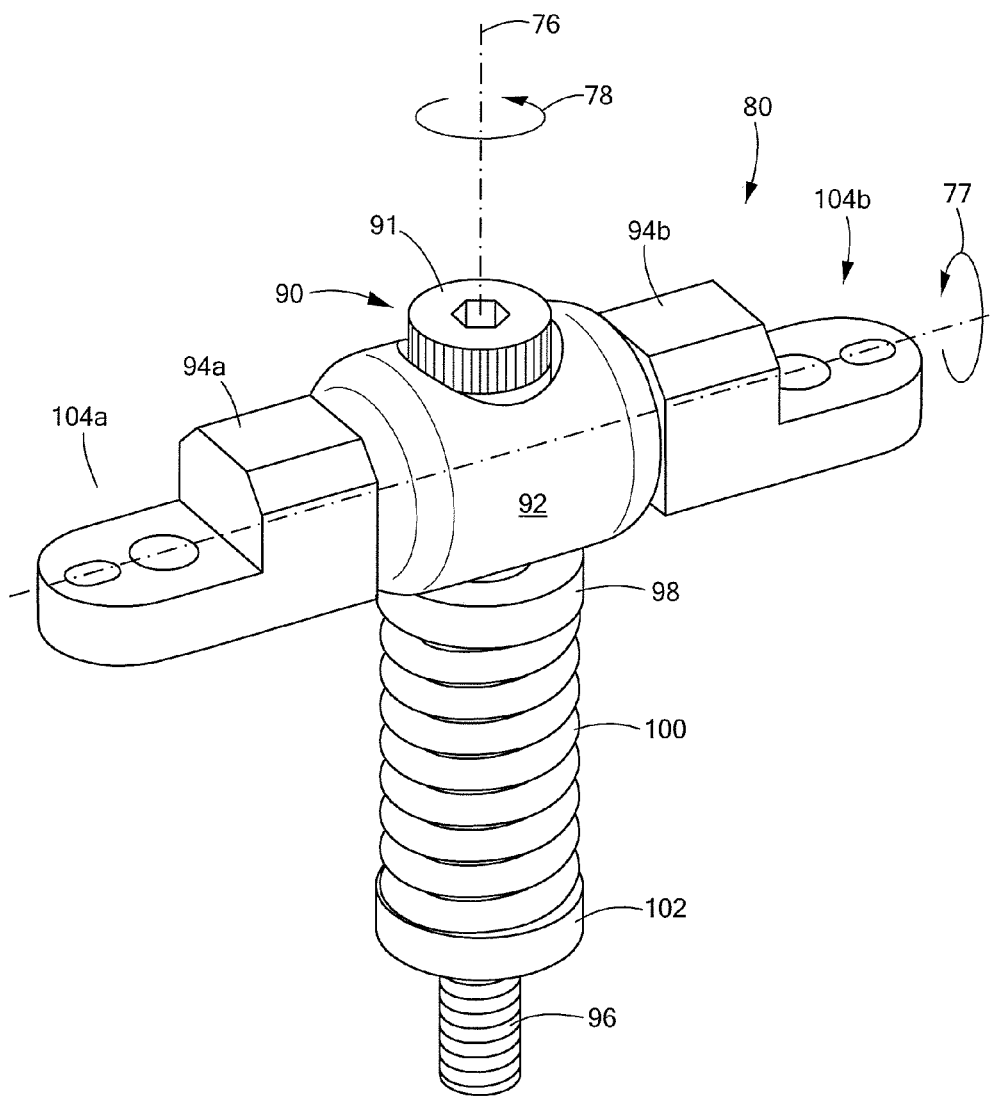
FIG. 7 is an isometric view of a translating hinge.
Figure 7A:
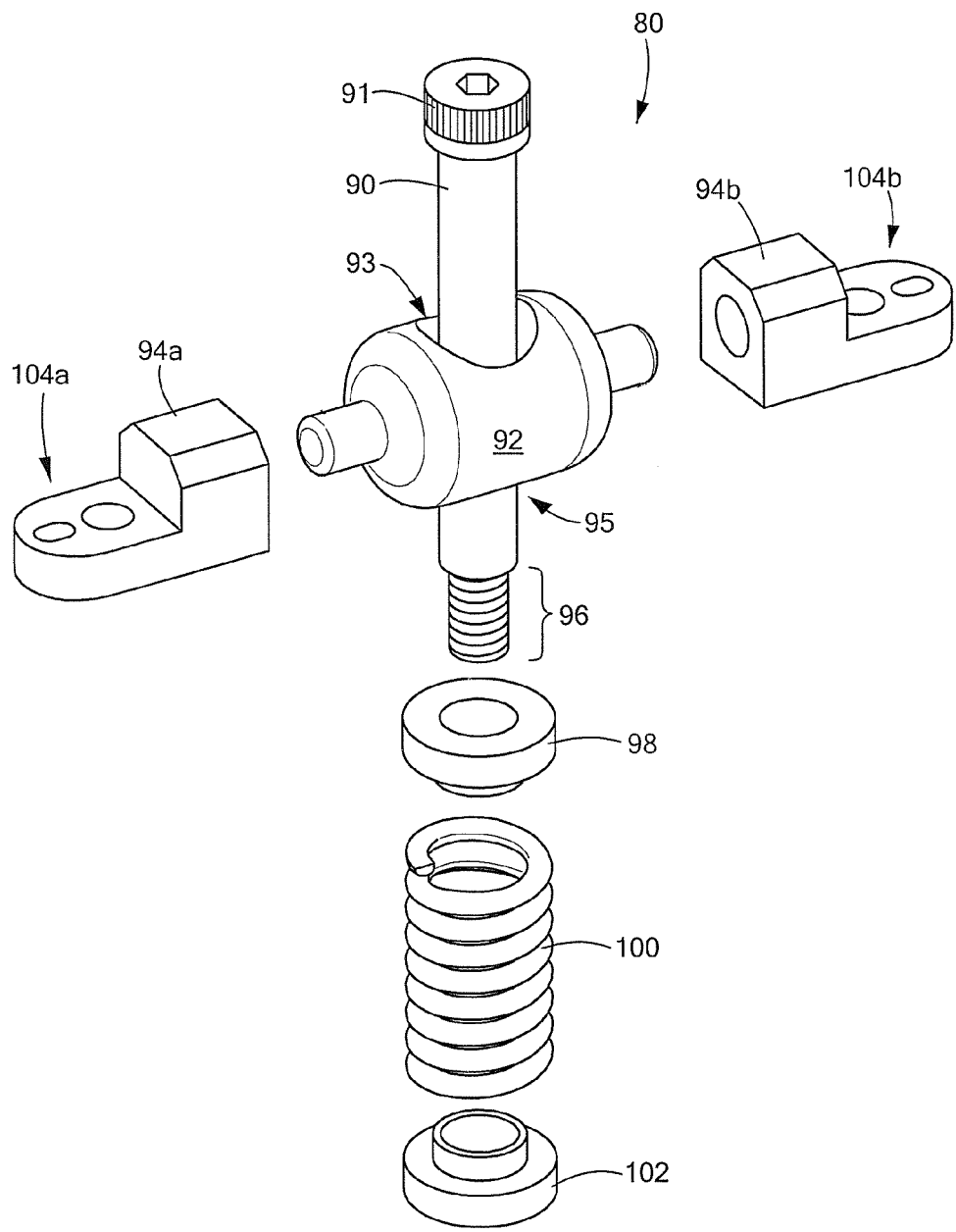
FIG. 7A is an exploded isometric view of the translating hinge of FIG. 7.

Referring now to FIGS. 6-7A, in which like elements are provided having like reference designations throughout the several views, a translating hinge 80 couples a first object 82 to a second object 84.

In FIG. 6, one or more fasteners 86 (only one fastener being shown in FIG. 6 for clarity) secure the first and second objects 82, 84 in a closed or engaged position meaning that surfaces of the two objects 82, 84 are in close proximity to each other or in contact with each other. The specific positioning of objects coupled by a translating hinge depends upon a variety of factors and the needs of the particular application in which the hinge is being used. For example, in the case of the RF system having a panel architecture described above in conjunction with FIGS. 1-5C, at least some portions of surfaces of the respective heat sinks 14, 16 are in contact for reasons related to mechanical and electrical connections of the panel array.

It should, however, be appreciated that in other applications actual contact between surfaces of the objects coupled by the translating hinge may not be necessary or even desired. Thus, the particular dimensions of the components which comprise the hinge are selected to satisfy the needs of the particular application in which the hinge is being used. Those of ordinary skill in the art will appreciate, after reading the description provided herein, how to select the particular dimensions of the components which comprise the hinge for a particular application.

The translating hinge includes a screw 90 which passes through a hinge pin 92 having a pair of yoke blocks 94a, 94b projecting from opposing ends thereof. In one embodiment, screw 90 is provided as shoulder screw. Use of shoulder screws in alignment applications is sometimes preferred since such screws are typically fabricated to precise tolerances and are intended for such applications. Thus the tolerance on the shoulder diameter is made to industry standards. Standard tolerance on the diameter is usually +/−0.001". Higher precision parts having tolerances of +/−0.0005" can also be used. A tightly toleranced shoulder screw accurately locates the hinge assembly with respect to first and second objects 82, 84.

The hinge pin 92 has a first or top surface having a recess 93 provided therein which accepts a head 91 of the shoulder screw 90. A shank 95 of the shoulder screw 90 includes a threaded portion 96 (visible in FIG. 7 and 7A). Shank 95 passes through the hinge pin 92. Recess 93 may, for example, be provided by counter-boring the hinge pin. Other techniques may also be used to provide recess 93. The hinge pin keeps the assembly low profile by allowing the head of the shoulder screw to bury itself in the pin recess after translation is complete. It should be noted that the hinge pin need not be circular. It could be block shape, or other shapes, depending upon the application.

A first washer 98 is disposed over the shank of the shoulder screw and is disposed against a second or bottom surface of the hinge pin 92. A spring 100 (which may be provided, for example, as a compression spring) is disposed over the shank of the screw. The appropriate spring stiffness is selected to ensure translation only occurs when desired. A first end of the compression spring is disposed against a surface of the first washer 98 and a second end of the compression spring disposed against a surface of a second washer 102 which is also disposed over the shank 95 of screw 90. Shoulder washers 98, 102 keep the spring 100 centered on the screw 90 and create a relatively smooth bearing surface against the hinge pin.

The shoulder screw's precise diameter accurately locates the hinge assembly while the two separate yokes 94a, 94b and alignment slots 104a, 104b (FIGS. 7 and 7A) account for spaces (which are a result of manufacturing tolerances) between the pin and the yoke and allow such spaces to be removed during assembly. The tolerance stack-up that exists between the hinge pin, yokes and alignment pins on the rear heat sink (e.g. a cold plate) must be accounted for in order to prevent a gap between the yoke and hinge pin. If there were to be a gap, the hinge pin would be free to move up and down which would significantly compromise the assembly tolerance of the front and rear heat sink assemblies. This effect could result in the shorting of interconnects and/or damage to interconnects. The slots 104a, 104b in the two separate yokes 94a, 94b solve this problem by accommodating all of the tolerances which occur due to tolerance stack ups which result due to fabrication of practical components such as the yoke and hinge pin. The slots 104a, 104b fit precisely over pins 105 (FIG. 6A) in the rear heat sink. This pin/slot configuration constrains the yoke in a first direction (e.g. a horizontal or x-direction) while still allowing the yoke to be pressed up flush in a second orthogonal direction (e.g. a y-direction) to the hinge pin. Once tolerances are eliminated, the fastener 106 (FIG. 6A) on each yoke is tightened (in a preferred embodiment the fasteners are torqued to a predetermined level). The result is the two hinged assemblies are now precisely aligned to one another.

It should be appreciated that machined parts having tight tolerances and the counter bored threaded hole for the shoulder screw ensure very precise alignment between hinged objects. In applications which have blind mate interconnects between the two objects, such precise alignment provided by the translating hinge is critical to guarantee blind mate interconnects can be successfully mated. No other alignment features are needed between the assemblies. In applications which do not require any blind mate interconnects, the tolerances need not be as tight which results in less expensive parts.

The hinge is made self supporting during rotation by properly sizing the spring to firmly hold the rotating assembly in a retracted position during rotation. This prevents accidental contact and potential damage between coupled objects and between other components in proximity to the objects coupled by the translating hinge.

Figure 6A:
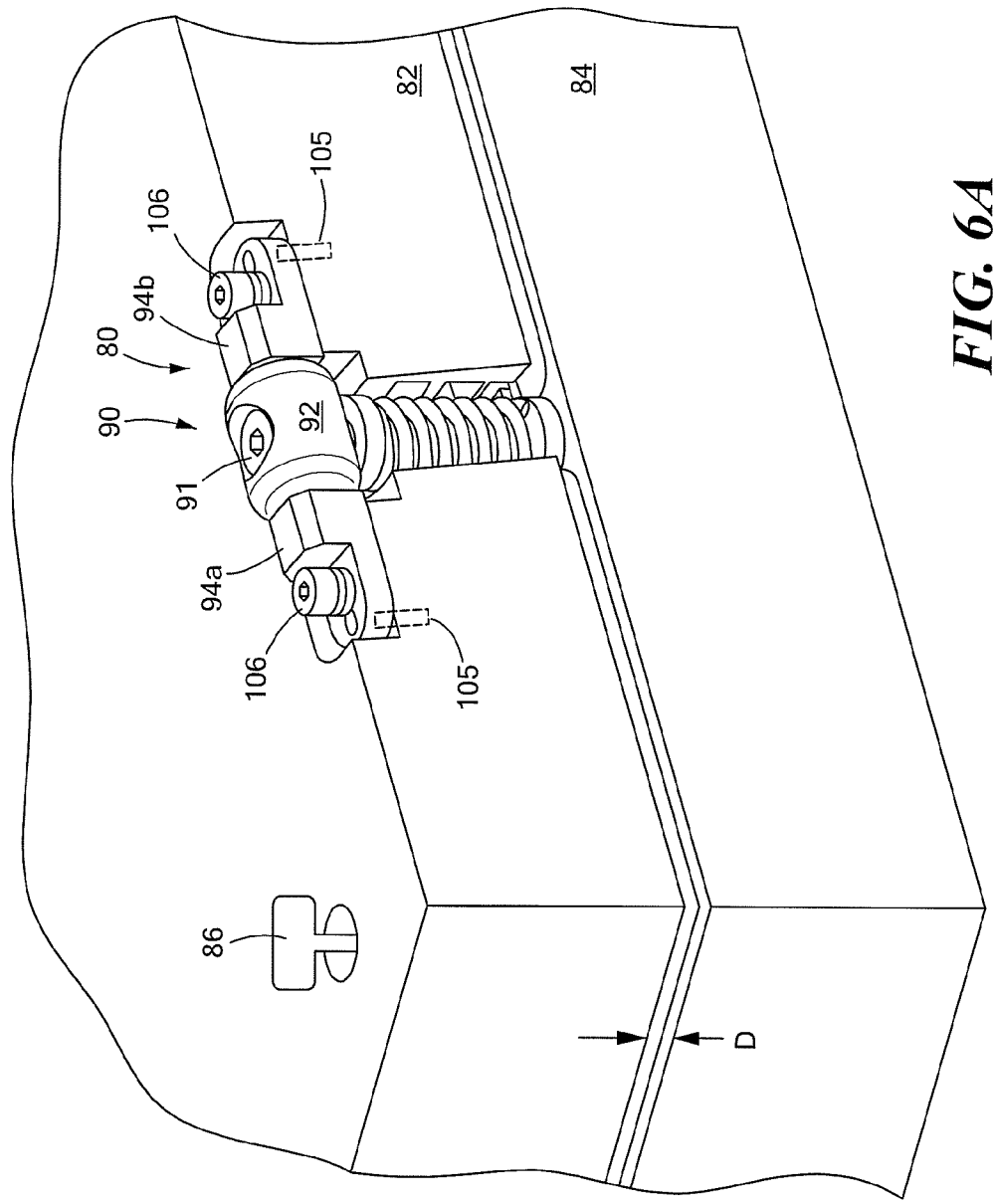
FIG. 6A is an enlarged isometric view of the translating hinge of FIG. 6 in a translated position.

The translation length is indicated by a distance D (FIG. 6A). As mentioned above in the description of FIGS. 5-5C, the translation length can be modified (e.g. either shortened or lengthened). In the embodiment shown in FIGS. 6-7A, and as will be described in more detail hereinbelow, by changing the length of the shoulder screw 90 (e.g. shortening or lengthening the length of the shoulder screw), it is possible to change the translation length. Allowing changes in the translation length increases the number of different mechanical structures which may be coupled by the translating hinge.

As may be most clearly seen in FIGS. 7 and 7A, shoulder screw 90 passes through the hinge pin 92 and the pair of yoke blocks 94a, 94b project from opposing ends of hinge pin 92. The recess 93 is provided in a first or top surface of the hinge pin. The recess accepts the head 91 of the shoulder screw 90 while shank 95 of the shoulder screw passes through the hinge pin. The counter bored hinge pin keeps the assembly low profile by allowing the head of the shoulder screw to bury itself in the pin after translation is complete. A first washer is disposed over the shank 95 of the shoulder screw and is disposed against a second or bottom surface of the hinge pin. A compression spring is disposed over shank 95 of the screw. The appropriate spring stiffness is selected to ensure translation only occurs when desired. A first end of the compression spring disposed against a surface of the first washer and a second end of the compression spring disposed against a surface of the second washer. The shoulder washers keep the spring centered on the screw and created a smoother bearing surface during rotation Shoulder screw's precise diameter accurately locates the hinge assembly while the two separate yokes and alignment slots account for spaces (which are a result of manufacturing tolerances) between the pin and the yoke and allow such spaces to be removed during assembly.

As mentioned above, by providing machined parts having tight tolerances and a counter-bored threaded hole for the shoulder screw ensures very precise alignment between the hinged assemblies. Such precise alignment is significant in applications having mechanical and electrical interconnects (e.g. including, but not limited to blind mate interconnects) since precise alignment to ensure interconnects can be successfully made. No other alignment features are needed between the assemblies.

As also mentioned above, in preferred embodiments, the hinge is self supporting during rotation. This is accomplished by properly sizing the spring to firmly hold the assembly being rotated in the retracted position during rotation. This prevents accidental contact and potential damage.

As also mentioned above, in preferred embodiments, the translation element provides a true vertical translation. In other embodiments, off-axis vertical translations may be preferred or even necessary. This may be accomplished, for example, by utilizing an off-angle or curved shoulder screw and appropriately modified hinge assembly and spring. It should be appreciated that the spring may be provided as a compression spring, an extension spring or another type of spring. The translation length can be modified by shortening or lengthening the shoulder screw. It should also be appreciated that any type of screw or pin may also be used.

As illustrated by reference numerals 76, 77 and 78 in FIG. 7, translating hinge 80 provides rotation in two orthogonal directions with respect to the direction of translation. As shown in FIG. 7, reference numeral 76 corresponds to a direction of translation for hinge 80. Reference numeral 77 corresponds to a first direction of rotation for hinge 80 while reference numeral 78 corresponds to a second orthogonal direction of rotation for hinge 80.

It should be thus be appreciated that translating hinge 80 translates in a first direction (e.g. a direction which is perpendicular to mating surfaces between two objects) and that rotation can occur in either of two directions. In particular, the translating hinge can be made to rotate in a direction which is orthogonal to the direction of translation as indicated by reference numeral 77 in FIG. 7 (and as illustrated by reference numerals 67 in FIG. 5B and reference numeral 74 in FIG. 5C) and/or the translating hinge can be made to rotate in a direction which is parallel to the mating surfaces (as indicated by reference numeral 78 in FIG. 7).

It should be appreciated, however, that it is important (and in some instances required) for at least two or more of the axis (depending on the number of hinges used) to be inline with each other. In other words, either all of the axis of rotations or all of the axis of translations have to be aligned to prevent binding of the translating hinges with each other during their translating/rotating operations.

Figure 8:
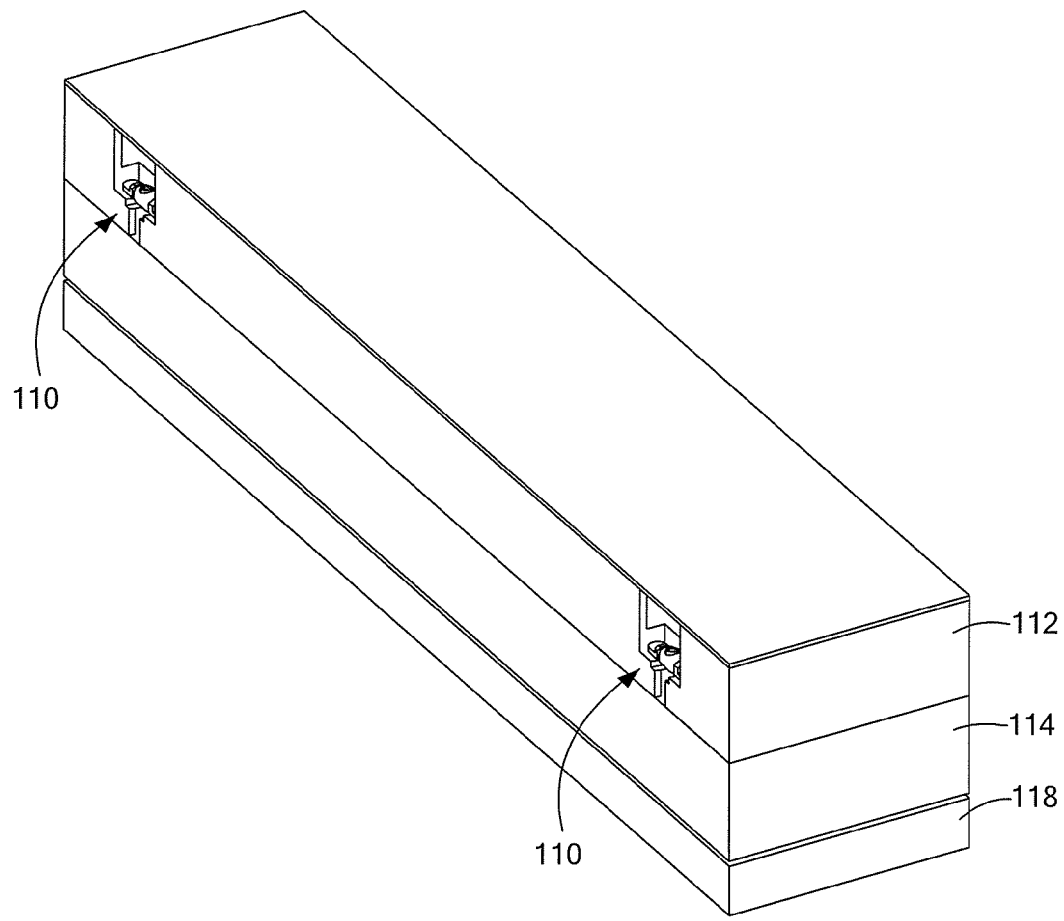
FIGS. 8-8F are a series of views which illustrate translating hinges coupling a plurality of objects and the process of releasing the translating hinges.
Figure 8A:
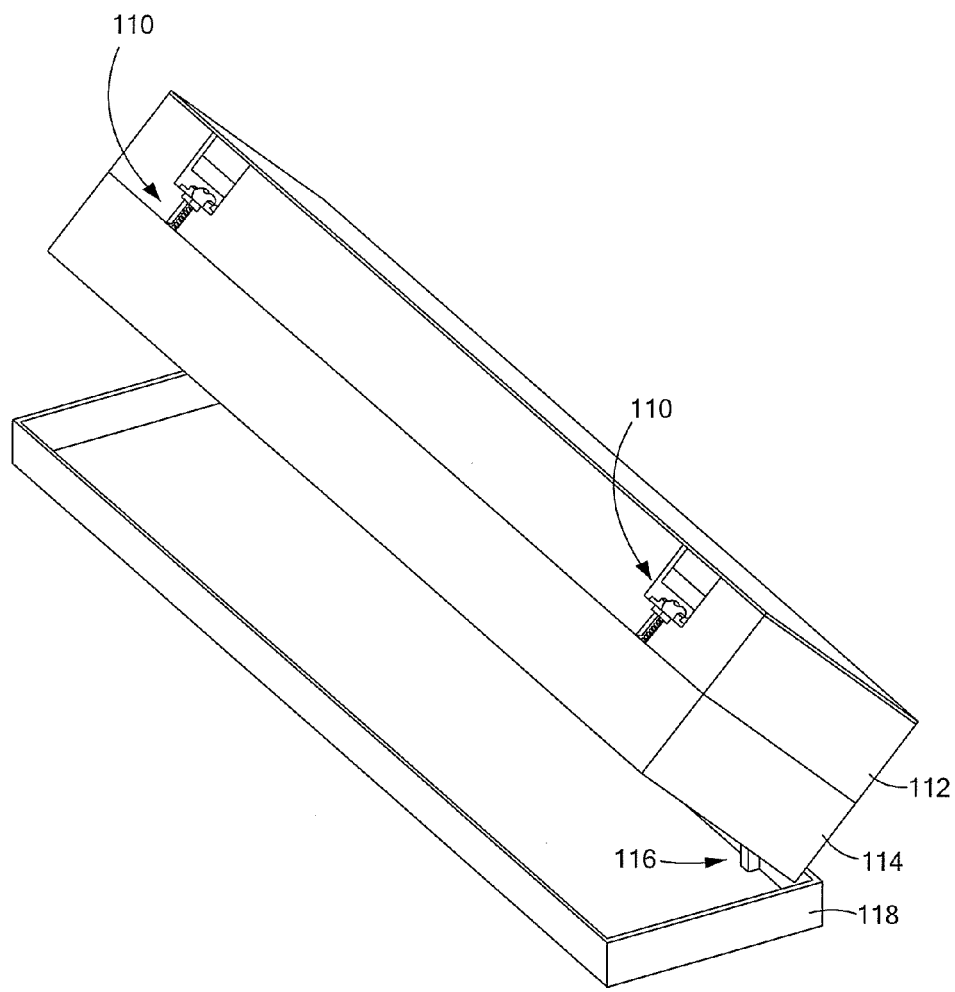
Figure 8B:
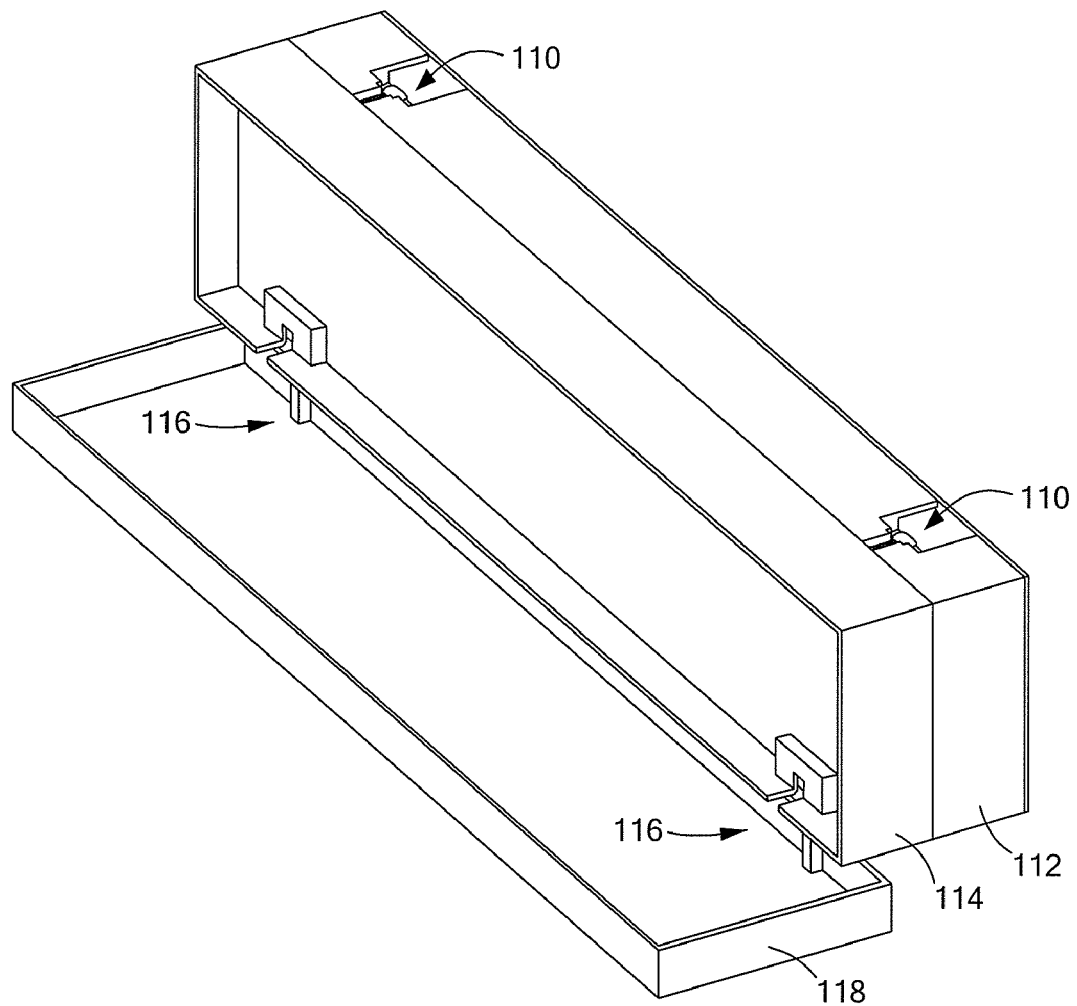
Figure 8C:
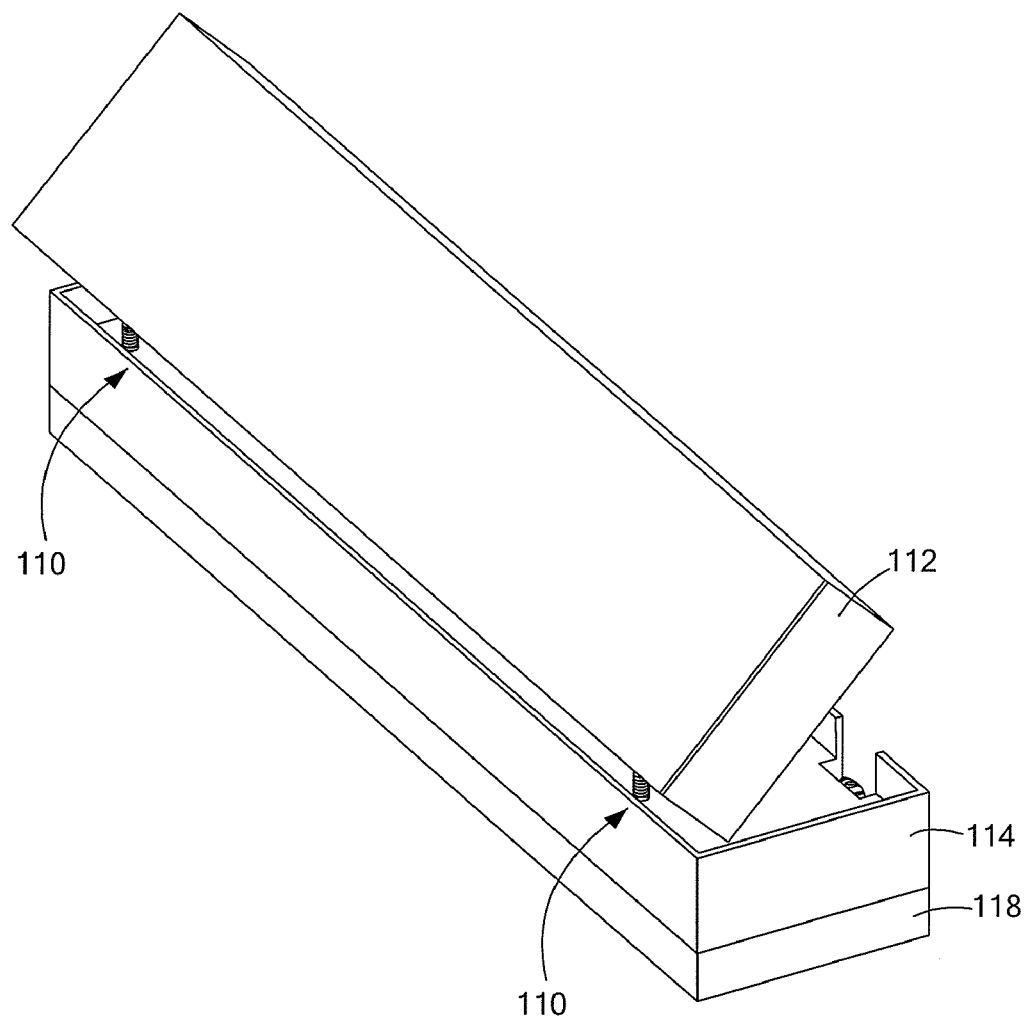
Figure 8D:
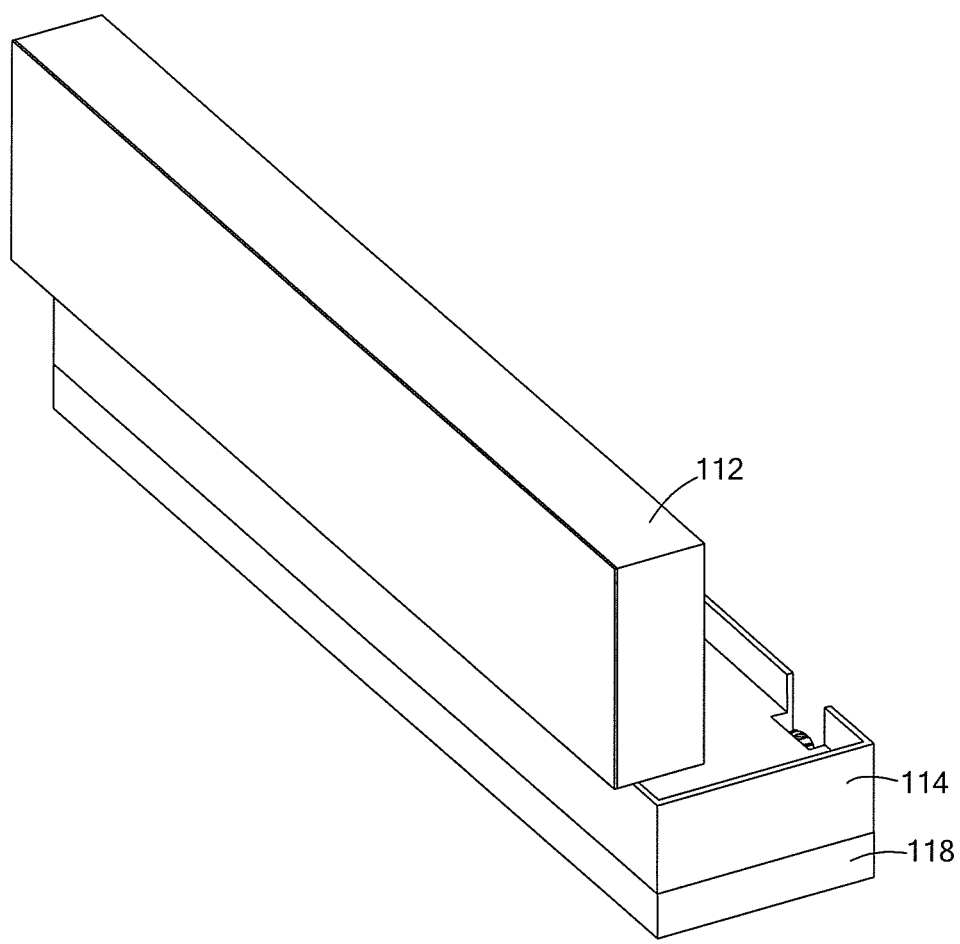
Figure 8E:
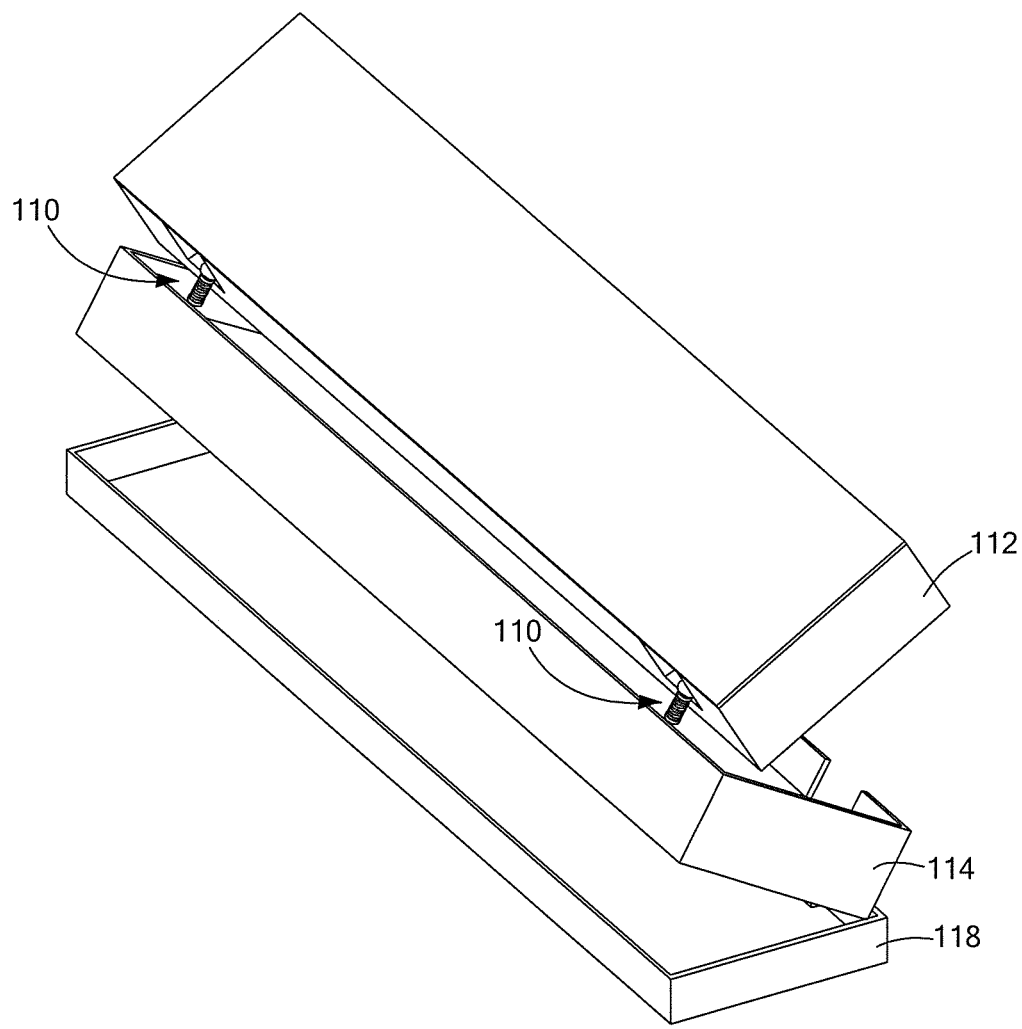
Figure 8F:
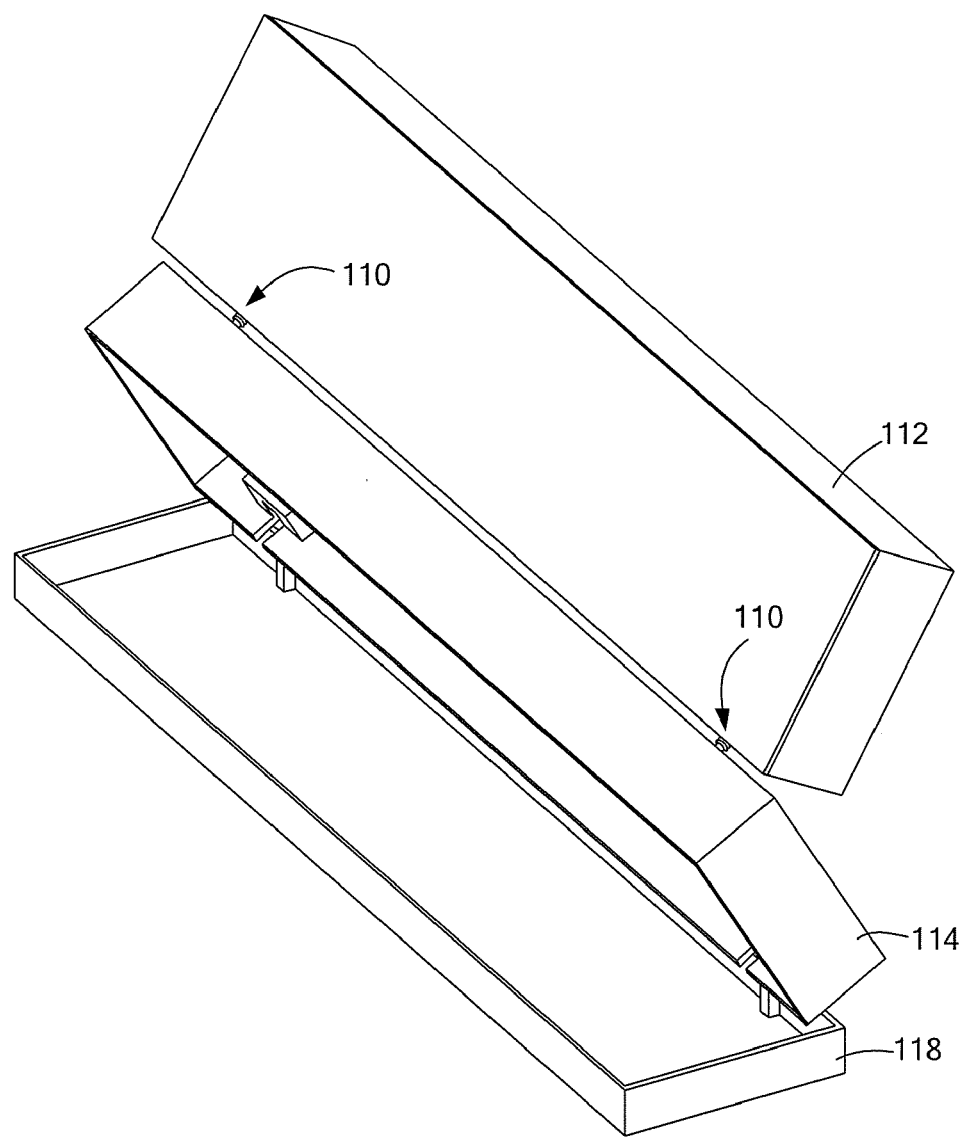

Referring now to FIGS. 8-8F in which like elements are provided having like reference designations throughout the several views, translating hinges 110 couple a first object 112 to a second object 116. 84. Translating hinges 110 operate in the same manner as translating hinges 30, 52 and 80 described above in respective ones of FIGS. 1-7A. A second pair of translating hinges 116 couple the second object 114 to a third object 118. Translating hinges 116 operate in the same manner as translating hinges 30, 52 and 80 described above in respective ones of FIGS. 1-7A. It should be appreciated that at least one of the translating hinges 110 in FIGS. 8-8F do not include springs.

The translating hinges 110, 116 allow more than two layers of components to be hinged together and independently accessible. For example, a stack of three objects 112, 114, 188 or more than three objects can be coupled via translating hinges. Furthermore since the translation height of the translating hinges 1112, 116 can be adjusted, the translating hinges can couple objects of difference thicknesses (i.e. different heights). For example, in FIGS. 8-8F objects 112, 114 and 118 are all provided having different heights. Thus, the translating hinge itself is scalable to operate with objects of different sizes and shapes while at the same time providing system scalability (i.e. multiple translating hinges can be able to stack three or more layers of objects as shown in FIGS. 8-8F).

In view of the above, it is submitted that that scope of the patent should not be limited to the described embodiments, but rather should be limited only by the spirit and scope of the following claims.

What is claimed is:

1. A radio frequency (RF) system comprising:
   a first heat sink assembly of the RF system having a first surface;
   a second heat sink assembly of the RF system having a first surface and disposed over said first heat sink assembly, the first and second heat sink assemblies providing cooling to electronic components;
   a translating hinge coupled to said first and second heat sink assemblies, said translating hinge configured to translate in a direction normal to the first surface of a first one of said first and second heat sink assemblies and to rotate the second heat sink assembly away from the first heat sink assembly,
   wherein said translating hinge comprises:
     a translation element configured to move between a closed position and a translated position with the movement being solely in a substantially vertical direction between the first heat sink assembly and second heat sink assembly by raising the second heat sink assembly with respect to the first heat sink assembly, the vertical direction being perpendicular to mating surfaces of the first and second heat sink assemblies; and
     a rotating assembly coupled to said translation element, said rotating assembly configured to allow the second heat sink assembly to be rotated relative to the first heat sink assembly when the translation element is in a translated position.

2. The RF system of claim 1 wherein said translation element comprises:
   a hinge pin having first and second opposing surfaces with a first or top surface of said hinge pin having a hole provided therethrough;
   a pair of yoke blocks movably coupled to and projecting from opposing ends of said hinge pin, said yoke blocks coupled to a first one of said first and second heat sink assemblies;
   a screw disposed through the hole in said hinge pin and coupled to a second one of said first and second heat sink assemblies; and
   a spring disposed over the shank of the screw.

3. The RF system of claim 1 wherein said rotating assembly comprises:
   a pair of yoke blocks rotatably coupled to said translation element and coupled to a first one of said first and second heat sink assemblies such that said second heat sink assembly can rotate about said translation element.

4. The RF system of claim 1 wherein said translation element comprises:
   a hinge pin having a bore therethrough;
   a screw disposed through the bore in said hinge pin; and
   a spring disposed over the screw with a first end of said spring disposed against a first surface of said hinge pin.

\* \* \* \* \*